US009818962B2

(12) United States Patent
Li

(10) Patent No.: US 9,818,962 B2
(45) Date of Patent: Nov. 14, 2017

(54) ORGANIC ELECTROLUMINESCENT ELEMENT AND METHOD FOR MANUFACTURING SAME

(71) Applicant: Konica Minolta, Inc., Tokyo (JP)

(72) Inventor: Hiromoto Li, Machida (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/022,713

(22) PCT Filed: Jan. 14, 2015

(86) PCT No.: PCT/JP2015/050735
§ 371 (c)(1),
(2) Date: Mar. 17, 2016

(87) PCT Pub. No.: WO2015/115175
PCT Pub. Date: Aug. 6, 2015

(65) Prior Publication Data
US 2017/0110677 A1  Apr. 20, 2017

(30) Foreign Application Priority Data

Jan. 31, 2014 (JP) .................. 2014-016375

(51) Int. Cl.
*H01L 51/52* (2006.01)
*H01L 51/00* (2006.01)
(Continued)

(52) U.S. Cl.
CPC ...... *H01L 51/0097* (2013.01); *H01L 51/5024* (2013.01); *H01L 51/5206* (2013.01); *H01L 51/5237* (2013.01); *H01L 51/56* (2013.01)

(58) Field of Classification Search
None
See application file for complete search history.

(56) References Cited

U.S. PATENT DOCUMENTS

2002/0041975 A1* 4/2002 Ueda ............... H01L 51/5221
428/690
2003/0043571 A1* 3/2003 Toguchi ............ H01L 51/5231
362/84
(Continued)

FOREIGN PATENT DOCUMENTS

JP        2009302029 A   12/2009
KR   10-2013-0076402 A1   7/2013
(Continued)

OTHER PUBLICATIONS

Office Action dated Jan. 12, 2017 from the corresponding Korean Application No. 10-2016-7007031; Applicant: Konica Minolta Inc.; English translation of Office Action; Total of 9 pages.
(Continued)

*Primary Examiner* — Michelle Mandala
(74) *Attorney, Agent, or Firm* — Lucas & Mercanti, LLP

(57) ABSTRACT

An organic electroluminescent element contains, on a base, at least a pair of electrodes that are arranged so as to face each other and a group of organic function layers including a light emitting layer, the group of organic function layers being held between the pair of electrodes. The base is a resin base having a thickness within the range of 3-50 μm, and the resin base-side electrode is a transparent positive electrode that is mainly composed of silver and has a thickness within the range of 2-20 nm.

7 Claims, 2 Drawing Sheets

(51) Int. Cl.
      *H01L 51/50*      (2006.01)
      *H01L 51/56*      (2006.01)

(56) References Cited

U.S. PATENT DOCUMENTS

2012/0241889 A1*   9/2012   Takemura ............. H01L 51/448
                                                              257/431
2015/0340641 A1*  11/2015   Kuroki ................. C07D 405/14
                                                              257/40

FOREIGN PATENT DOCUMENTS

WO       2013141057 A1    9/2013
WO       2013157515 A1   10/2013

OTHER PUBLICATIONS

International Search Report dated Mar. 17, 2015 for PCT/JP2015/050735 and English translation.
IPRP dated Mar. 17, 2015; International Application No. PCT/JP2015/050735; Applicant: Konica Minolta, Inc.; English translation of IPRP; Total of 7 pages.
Office Action dated Jul. 31, 2017 from the corresponding Korean Patent Application No. KR 10-2016-7007031 and English translation.

* cited by examiner

ORGANIC ELECTROLUMINESCENT ELEMENT AND METHOD FOR MANUFACTURING SAME

CROSS REFERENCE TO RELATED APPLICATION

This Application is a 371 of PCT/JP2015/050735 filed on Jan. 14, 2015, which, in turn, claimed the priority of Japanese Patent Application No. JP2014-016375 filed on Jan. 31, 2014, both applications are incorporated herein by reference.

TECHNICAL FIELD

The present invention relates to an organic electroluminescent device and a method of producing the device. In particular the present invention relates to an organic electroluminescent device having high durability against bending and a method of producing the device.

BACKGROUND ART

Organic electroluminescent devices (hereinafter also referred to as "organic EL devices"), which utilize electroluminescence (hereinafter abbreviated as "EL") from organic materials, have been used as thin light-emitting materials. Organic EL devices are fully solid-state elements in the form of thin films and can emit light at a low voltage of several volts to several tens of volts. Organic EL devices have a variety of advantageous characteristics, such as high luminance, high luminescence efficiency, low profile, and lightweight.

For this reason, organic EL devices have been attracted attention as surface-emitting articles, such as backlights of various displays, display boards, e.g., billboards and emergency lights, and illumination sources. In particular, an organic EL device including a thin and lightweight resin substrate provided with a gas barrier layer has attracted attention as a light-emitting device because such an organic EL device has high flexibility (pliability) and can be naturally and elastically bent when disposed on curved members or bent as desired, and thus is beneficial for providing dramatic rendering and decoration.

To form a transparent conductive layer, e.g., an ITO (indium tin oxide) film, as a transparent electrode layer on a thin resin substrate, sputtering is often employed in view of its characteristics. Unfortunately, the formation of a transparent electrode layer by sputtering exposes a thin resin substrate to high temperature, and the resin substrate is thermally deformed, which impairs its smoothness and cause, for example, wrinkles. Consequently, cracks and wrecks are formed in the transparent conductive layer on the thin substrate, and such a transparent conductive layer is readily broken when it is bent.

To address this problem, a method of producing a flexible transparent conductive film and functional element has been disclosed. This method involves the formation of a transparent conductive layer with a fine conductive particulate oxide, such as a fine particulate ITO (indium tin oxide), on a 3 to 50 μm-thick resin substrate by a coating process, and then compression of the layer (see, for example, Patent Literature (PLT) 1).

In the case of forming a transparent conductive layer on a thin transparent resin substrate by a coating process, the thin transparent resin substrate is not thermally damaged during the formation. Unfortunately, it is revealed that the sheet resistance of the formed transparent conductive layer is far away from a desired resistance for an electrode of an organic electroluminescent device. To address this problem on the resistance, annealing can be performed at approximately 300° C. after the formation of a transparent conductive layer of ITO (indium tin oxide) to lower the resistance of the transparent conductive layer. Unfortunately, this annealing also causes thermal deformation of a thin transparent resin substrate like sputtering. Thus, it has been difficult to produce a transparent conductive article having a desired resistance using a thin resin substrate.

Meanwhile, an organic electroluminescent device including a transparent conductive layer formed with silver or an alloy primarily composed of silver is disclosed (see, for example, PLT 2). PLT 2 states that the formation of a transparent conductive layer with silver or an alloy primarily composed of silver achieves a thinner transparent conductive layer, i.e., a transparent conductive layer having high-light transmittance and sufficient conductivity, and the resulting organic electroluminescent device has enhanced luminescence efficiency and lifetime parameters.

Unfortunately, PLT 2 merely describes a method using an approximately 0.7 mm-thick glass substrate. PLT 2 has no description or suggestion on the use of a thin resin substrate having a thickness of 50 μm or less, thermal deterioration of the smoothness of such a thin resin substrate, importance of providing a transparent conductive layer formed on such a thin resin substrate with durability against bending stress, and ways to address the problems.

Another method of producing a transparent conductive film is also disclosed (see, for example, PLT 3), where the transparent conductive film includes a substrate, a modified polysilazane layer on the substrate, and a metal layer formed with silver or an alloy primarily composed of silver on the modified polysilazane layer. PLT 3 states that a method described therein can produce a transparent conductive layer having sufficient conductivity and light transmittance, as well as a high moisture-blocking effect.

In such a configuration, unfortunately, the formation of a metal layer composed of silver or an alloy primarily composed of silver directly on a modified polysilazane layer barely provides a uniform metal layer. Furthermore, PLT 3 has no specific description on the use of a thin resin substrate having a thickness of 50 μm or less, and no description or suggestion on bending durability of a transparent conductive layer on such a thin resin substrate and ways to address the problems.

Related Art Documents

Patent Documents
PLT 1: Japanese Unexamined Patent Application Publication No. 2009-302029
PLT 2: International Patent Publication WO2013/141057
PLT 3: International Patent Publication WO2013/157515

SUMMARY OF THE INVENTION

Problems to be Solved by the Invention

The present invention has been accomplished to address the above problems. An object of the present invention is to provide an organic electroluminescent device including a thin resin substrate and having high pliability, high flexibility, and high durability against bending stress, and to provide a method of producing the device.

Means for Solving the Problems

The present inventors, who have conducted intensive studies to solve the above problems, have accomplished an organic electroluminescent device including a substrate, a pair of counter electrodes on or above the substrate, and an organic functional layer group including a luminous layer and disposed between the electrodes, wherein the substrate is a resin substrate having a thickness in the range of 3 to 50 μm, and the electrode adjacent to the resin substrate is a transparent anode primarily composed of silver and having a thickness in the range of 2 to 20 nm. Such an organic electroluminescent device has high pliability, high flexibility, and high durability against bending stress. The present invention is thereby accomplished.

More specifically, the above problem of the present invention is solved by the following means.

1. An organic electroluminescent device including:
   a substrate;
   a pair of counter electrodes on or above the substrate; and
   an organic functional layer group including a luminous layer and disposed between the electrodes,
   wherein the substrate is a resin substrate having a thickness in the range of 3 to 50 μm, and the electrode adjacent to the resin substrate is a transparent anode primarily composed of silver and having a thickness in the range of 2 to 20 nm.

2. The organic electroluminescent device according to item 1, further including an underlying layer on a side of the transparent anode, the side being adjacent to the resin substrate, the underlying layer including an organic compound containing a nitrogen or sulfur atom.

3. The organic electroluminescent device according to item 2, wherein the organic compound contained in the underlying layer is an organic compound containing a nitrogen atom having an effective unshared electron pair which is not involved in aromaticity.

4. The organic electroluminescent device according to any one of items 1 to 3, wherein the resin substrate resides on a light emitting side, the organic electroluminescent device further includes a gas barrier layer between the resin substrate and the transparent anode, and the gas barrier layer is a modified polysilazane layer.

5. The organic electroluminescent device according to any one of items 1 to 4, wherein the transparent anode is disposed in a neutral region of stress generated when the organic electroluminescent device undergoes bending moment.

6. A method of producing an organic electroluminescent device including forming a pair of counter electrodes on or above a substrate, and an organic functional layer group including a luminous layer and disposed between the electrodes,
   wherein the substrate is a resin substrate having a thickness in the range of 3 to 50 μm, the electrode adjacent to the resin substrate is a transparent anode primarily composed of silver and having a thickness in the range of 2 to 20 nm, and the transparent anode is formed by deposition.

7. The method of producing an organic electroluminescent device according to item 6, wherein an underlying layer including an organic compound containing a nitrogen or sulfur atom is formed at a side of the transparent anode, the side being adjacent to the resin substrate.

8. The method of producing an organic electroluminescent device according to either item 6 or 7,
   wherein the resin substrate resides on a light emitting side, a gas barrier layer is formed between the resin substrate and the transparent anode by modifying a polysilazane-containing layer by vacuum UV irradiation.

Advantageous Effects of the Invention

The above aspects of the present invention can provide an organic electroluminescent device including a thin resin substrate and having high pliability, high flexibility, and high durability against bending stress, and a method of producing the device.

The plausible reasons why the aspects of the present invention can solve the above problems are as follows.

An organic EL device including an extremely thin resin substrate having a thickness in the range of 3 to 50 μm is readily deformed (expanded and/or contracted) by environmental changes. More specifically, an organic EL device including an extremely thin resin substrate having a thickness in the range of 3 to 50 μm has significantly low "flexural rigidity", which is a parameter and the product of the Young's modulus and the cross-sectional secondary moment. Consequently, such an organic EL device has enhanced elasticity (pliability) but is sensitive to deformation stress. The present inventors, who have conducted intensive studies on this sensitivity, have found that a transparent electrode of an organic EL device is significantly sensitive to deformation stress.

The present inventors have then conducted detailed studies on requirements for achieving a transparent electrode with sufficient durability against deformation, and have found that the above problems can be solved by making an electrode, which is one of a pair of counter electrodes and adjacent to a resin substrate, to be primarily composed of silver and have a thickness in a specific range. The present invention has been thereby accomplished.

EMBODIMENTS FOR CARRYING OUT THE INVENTION

Figure 1A:
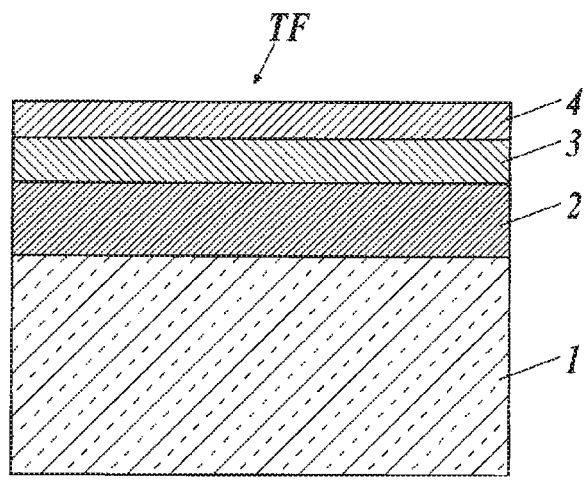
FIG. 1A is a schematic cross-sectional view illustrating a typical layered structure of a transparent conductive film of the present invention.

The organic electroluminescent device of the present invention includes a substrate, a pair of counter electrodes on or above the substrate, and an organic functional layer group including a luminous layer and disposed between the electrodes, wherein the substrate is a resin substrate having a thickness in the range of 3 to 50 μm, and the electrode adjacent to the resin substrate is a transparent anode primarily composed of silver and having a thickness in the range of 2 to 20 nm. Such an organic electroluminescent device achieves high pliability, high flexibility, and high durability against bending stress. Inventions according to items 1 to 8 all have these technical features in common.

In a preferred embodiment, to enhance the effects of the present invention, the organic EL device of the present invention further includes at least an underlying layer on a side of the transparent anode, the side being adjacent to the resin substrate, the underlying layer containing an organic compound containing a nitrogen or sulfur atom(s). The organic compound contained in the underlying layer preferably contains a nitrogen atom having an effective unshared electron pair which is not involved in aromaticity.

Prior to the formation of the transparent anode primarily composed of silver on the resin substrate, the underlying layer containing the nitrogen or sulfur atom-containing organic compound is formed on the resin substrate, and then the transparent anode is formed on the underlying layer. Silver atoms in the transparent anode interact with the nitrogen or sulfur atom-containing organic compound having silver affinity in the underlying layer. Such interaction reduces the diffusion distance of the silver atoms on the surface of the underlying layer and thus prevents local agglomeration of the silver atoms.

More specifically, two-dimensional nucleation of silver atoms occurs on the surface of the underlying layer containing a compound containing an atom(s) having affinity to a silver atom, and then two-dimensional growth of a monocrystal layer occurs from the two-dimensional nucleus. That is, laminar growth (Frank-van der Merwe or FM growth) occurs. Thus, a highly uniform transparent anode without unevenness can be formed.

Preferably, the resin substrate resides on a light emitting side, the organic electroluminescent device further includes a gas barrier layer between the resin substrate and the transparent anode, and/or the gas barrier layer is a modified polysilazane layer.

One of the technical features of the present invention is the use of a thin resin substrate. The use of a thin resin substrate in an organic EL device more readily allows harmful gases, such as moisture and oxygen, to intrude into layers of the organic EL device, as compared to the use of a traditional resin substrate having a thickness of a certain level. To enhance the stability and durability of the organic EL device, the use of a gas barrier layer at a specific position is significantly effective.

A thin resin substrate is readily deformed (expanded and/or contracted) by environmental changes due to its thinness. Along with this deformation, the transparent anode formed on or above the thin resin substrate is greatly deformed (subjected to a great stress) to cause cracks and/or wrecks in the transparent anode. To solve this problem, a gas barrier layer that has high hardness and is barely deformed is disposed between the resin substrate and the transparent anode (or the transparent anode provided with the underlying layer), which can decrease the influence of the deformation of the resin substrate on the transparent anode.

A thin resin substrate is somewhat inferior in its flatness (surface smoothness) to a resin substrate having a thickness of a conventional level. If a transparent anode primarily composed of silver is formed directly on the thin resin substrate, the surface asperity of the thin resin substrate is directly reflected to that of the transparent anode, and thus a uniform transparent anode is somewhat difficult to form.

To solve this problem, prior to the formation of the transparent anode, a polysilazane-containing coating solution is applied on the resin substrate by wet coating to form a precursor layer of the gas barrier layer to level and smooth the surface asperity of the resin substrate, and then a modification treatment, such as vacuum UV irradiation, is performed on the thin precursor layer to yield the gas barrier layer. This process is effective to form a highly smooth transparent anode.

The formation of the gas barrier layer by wet coating and the surface modification treatment does not expose the thin resin substrate to high temperature, in contrast to the formation by sputtering. In the modification treatment of the surface of the precursor layer of the gas barrier layer, a region around the surface exposed to the modification treatment is hardened to form a hard layer, whereas a deep region of the precursor layer is not fully hardened to form a more flexible layer compared to the region around the surface. Hence, the gas barrier layer has a hardness distribution.

Consequently, the deep region of the gas barrier layer which is flexible and relatively readily deformed resides on a side of the resin substrate which has high elasticity, while the surface region of the gas barrier region having high hardness by the modification treatment resides on a side of the transparent anode which has small elasticity. This enhances the relaxation of stress by environmental changes and prevents stress concentration at a specific area, whereby an organic EL device having high durability (tolerance to expansion and contraction) can be achieved.

Preferably, the transparent anode resides in a region that is neutral to stress generated when the organic electroluminescent device undergoes bending moment.

That is, the transparent anode primarily composed of silver and readily wrecked by stress, such as expansion and/or contraction, preferably resides in a region spanning a part of the total thickness of the organic EL device and including a neutral plane at which the tensile stress (TS) and the compressive stress (CS) are both minimized (hereinafter this region is referred to as a neutral region). This prevents the transparent anode from being wrecked by stress, such as bending stress. The total thickness of the organic EL device includes the thicknesses of the resin substrate, the transparent anode, the organic functional layer group, the cathode, and the sealing member.

The method of producing the organic EL device involves the formation of at least a pair of counter electrodes on or above a substrate and an organic functional layer group including a luminous layer and disposed between the electrodes, wherein the substrate is a resin substrate having a thickness in the range of 3 to 50 μm, the electrode adjacent to the resin substrate is a transparent anode primarily composed of silver and having a thickness in the range of 2 to 20 nm, and the transparent anode is formed by deposition.

The formation of the transparent anode by deposition does not expose the thin resin substrate to high temperature in contrast to the formation by sputtering. Consequently, thermal deformation of the thin resin substrate can be avoided.

The present invention, its components, and embodiments for carrying out the present invention will now be described in detail. In the present invention, every range described with "to" includes its upper and lower limits. In the following description, the alphanumerics in parentheses described with the components correspond to those in the drawings.

<<Fundamental Structure of Organic EL Device>>

The organic electroluminescent device of the present invention includes a substrate, a pair of counter electrodes on or above the substrate, and an organic functional layer group including a luminous layer and disposed between the electrodes. The substrate is a resin substrate having a thickness in the range of 3 to 50 μm, and the electrode adjacent to the resin substrate is a transparent anode primarily composed of silver and having a thickness in the range of 2 to 20 nm. The transparent anode having a thickness of 2 nm or more can function as an electrode, and the transparent anode having a thickness of 20 nm or less can have light transmittance suitable for an electrode on a light emitting side and cannot be an obstacle to emission of light from the organic EL device to the outside thereof.

In the present invention, a group composed of at least the resin substrate and the transparent anode primarily composed of silver is hereinafter referred to as a transparent conductive film.

Preferably, the organic EL device of the present invention further includes an underlying layer on a side of the transparent anode, the side being adjacent to the resin substrate, the underlying layer containing an organic compound containing a nitrogen or sulfur atom(s). Preferably, the organic EL device further includes a gas barrier layer between the resin substrate and the transparent anode, and the gas barrier layer is a modified polysilazane layer.

Figure 1B:
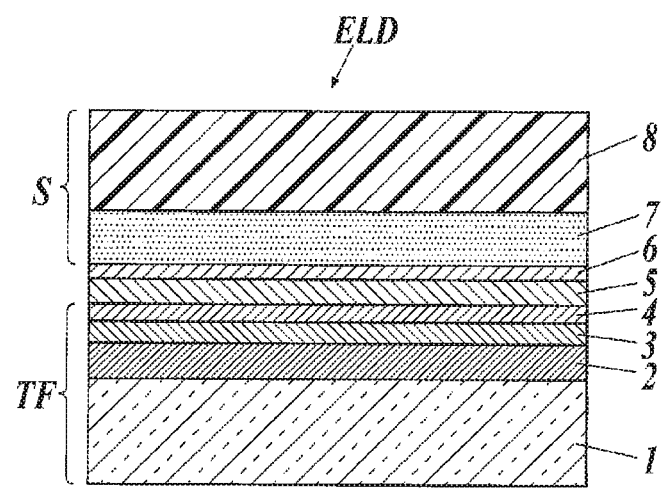
FIG. 1B is a schematic cross-sectional view illustrating a typical layered structure of an organic EL device of the present invention.

FIGS. 1A and 1B are schematic cross-sectional views illustrating typical layered structures of the transparent conductive film of the present invention and the organic EL device including the transparent conductive film of the present invention, respectively.

FIG. 1A illustrates fundamental components of the transparent conductive film (TF) of the present invention, i.e., a resin substrate (1) having a thickness in the range of 3 to 50 μm and a transparent anode (4) primarily composed of silver and having a thickness in the range of 2 to 20 nm above the resin substrate (1). Preferably, an underlying layer (3) resides on a side of the transparent anode (4), the side being adjacent to the resin substrate (1), and a gas barrier layer (2) formed by a modification treatment of a polysilazane-containing layer resides between the resin substrate (1) and the transparent anode (4).

FIG. 1B illustrates a typical structure of the organic EL device (ELD) including the transparent conductive film (TF) illustrated in FIG. 1A.

The organic EL device (ELD) illustrated in FIG. 1B is produced by forming an organic functional layer group (5) and a cathode (6) on or above the transparent conductive film (TF) described above, and then forming a sealing member (S) composed of an adhesion layer (7) and sealing material (8) on the cathode (6).

<<Neutral Region>>

Preferably, the transparent anode of the organic EL device of the present invention resides in a region that is neutral to stress generated when the organic electroluminescent device undergoes bending moment. The organic EL device including the neutral region of the present invention is, as illustrated in FIG. 1B, composed of a laminate of the transparent conductive film (TF), which includes the thin resin substrate (1) and the transparent anode (4), the organic functional layer group (5), the cathode (6), the adhesion layer (7), and the sealing material (8).

The neutral region defined in the present invention will now be described in detail with reference to the drawings.

Figure 2A:
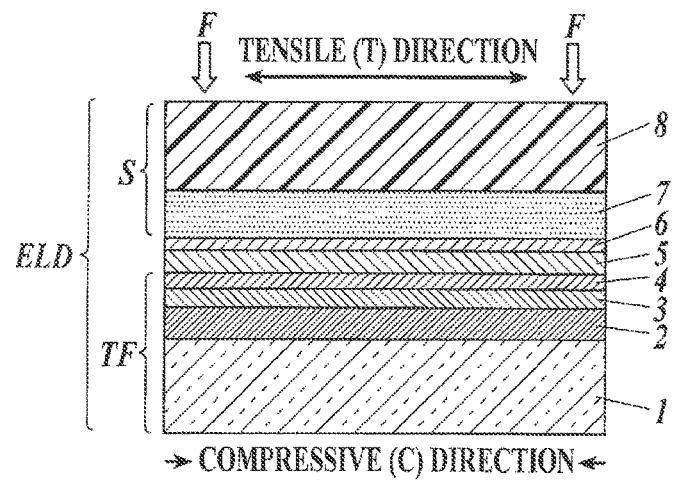
FIG. 2A is a schematic diagram of a structure illustrating an organic EL device of the present invention and bending stress on the organic EL device.
Figure 2B:
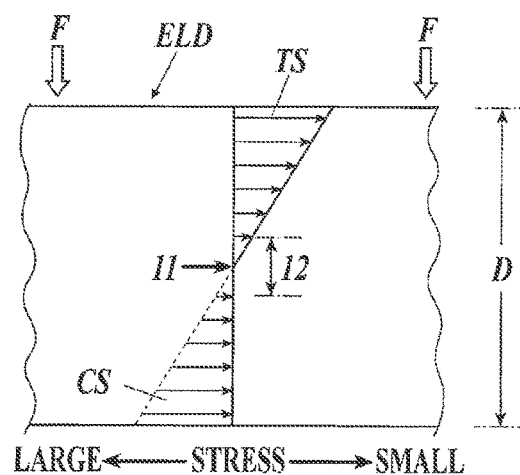
FIG. 2B is a schematic diagram illustrating a neutral region under application of bending stress.
Figure 2C:
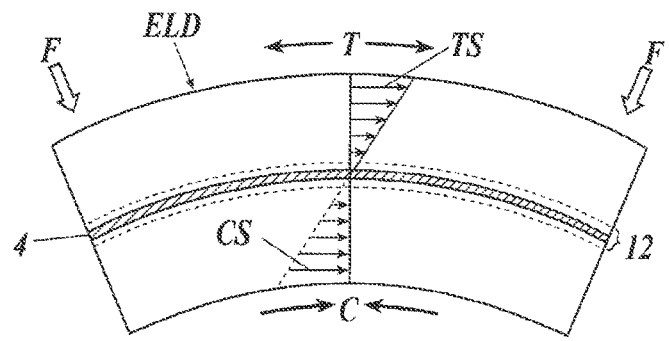
FIG. 2C is a schematic diagram illustrating a neutral region after application of tensile stress and compressive stress.

FIGS. 2A to 2C each illustrate an example of the organic EL device (ELD) corresponding to the organic EL device (ELD) illustrated in FIG. 1B.

The organic EL device (ELD) illustrated in FIG. 2A is produced by forming the organic functional layer group (5) and the cathode (6) on or above the transparent conductive film (TF), and then forming the sealing member (S) composed of the adhesion layer (7) and the sealing material (8), as described above.

When bending force (F) is applied to the ends of the upper surface of the organic EL device (ELD) having the above structure, tensile force (T) horizontally acts on the upper surface side including the sealing member (S). As illustrated in FIGS. 2B and 2C, tensile stress (TS) is then generated from the upper surface toward the depth direction of the organic EL device (ELD). The tensile stress (TS) gradually decreases from the sealing member (S) in the upper surface side to the middle of the depth direction and is zero or minimized at a plane, i.e., a neutral plane (11).

In contrast, when bending force (F) is applied to the ends of the upper surface, compressive force (C) horizontally acts on the surface of the resin substrate (1) on a light emitting side of the organic EL device (ELD). As illustrated in FIGS. 2B and 2C, compressive stress (CS) is then generated from the bottom surface of the resin substrate (1) toward the depth direction of the organic EL device. The compressive stress (CS) gradually decreases from the resin substrate (1) to the middle of the depth direction and is zero or minimized at the neutral plane (11).

As just described, the neutral plane (11) is a plane (point) where each stress caused by bending is zero or minimized, and the neutral region (12) is a region where each stress caused by bending is zero or minimized.

As illustrated in FIG. 2B, in the present invention, a stress point where each stress (TS, CS) is zero or minimized is defined as the neutral plane (11) or a neutral point, and a region extending upwardly and downwardly from the neutral plane (11) in the depth direction in the range of 10% of the total thickness D of the organic EL device (ELD) is defined as the neutral region (12). When the neutral plane (11) resides in the middle of the total thickness, i.e., resides at 50% of the total thickness away from the bottom surface of the resin substrate, the neutral region (12) resides at 40 to 60% of the total thickness away from the bottom surface of the resin substrate.

In the present invention, the neutral plane (11) or the neutral region (12) can be determined by, for example, a method of determining a neutral plane described in Japanese Unexamined Patent Application Publication No. 2005-251671 or No. 2006-58764.

In the present invention, the transparent anode (4) having a thickness in the range of 2 to 20 nm and primarily composed of silver resides in the neutral region (12) determined by, for example, the method described above. Thus, tensile force (T) and compressive force (C) are minimized in the region where the transparent anode (4) resides, and even if a great bending force is applied to the organic EL device (ELD), the transparent anode (4) can be prevented from being cracked and wrecked. In the present invention, the transparent anode (4) may be disposed in the neutral region (12), such that the transparent anode (4) resides entirely, as illustrated in FIG. 2C, or partly in the neutral region (12).

Examples of a method of disposing the transparent anode (4) in the neutral region (12) defined in the present invention include a method involving selecting materials for layers of the organic EL device (EL) so that these layers have longitudinal modulus suitable for disposing the neutral region (12) at a position where a point of action of the modulus resides, and a method involving selecting materials and adjusting the thicknesses of the resin substrate (1), the gas barrier layer (2), the adhesion layer (7), and/or the sealing material (8), the thicknesses of which have a high proportion to the total thickness of the organic EL device (ELD), to dispose the transparent anode (4) in the neutral region (12). In the latter method, the material and thickness of the adhesion layer (7), which has a relatively small contribution to functions of the organic EL device, is preferred to be considered and adjusted.

<<Components of Organic EL Device>>

Components of the organic EL device of the present invention will now be described in detail.

[Transparent Conductive Film]

The transparent conductive film of the present invention necessarily includes the resin substrate having a thickness in the range of 3 to 50 μm and the transparent anode (4) having a thickness in the range of 2 to 20 nm and primarily composed of silver on or above the resin substrate. Preferably, the transparent conductive film of the present invention further includes an underlying layer on a side of the transparent anode, the side being adjacent to the resin substrate, the underlying layer containing a nitrogen or sulfur atom-containing organic compound. The transparent conductive film of the present invention further includes, between the resin substrate and the transparent anode, the gas barrier layer formed by a modification treatment of a polysilazane-containing layer.

(Resin Substrate)

The substrate used in the organic EL device of the present invention is a resin substrate that is flexible and bendable, and has a thickness in the range of 3 to 50 μm.

The resin substrate of the present invention can be made with any resin material that can hold components described later.

Resin materials usable for making the resin substrate of the present invention includes: polyesters, such as poly(ethylene terephthalate) (PET) and polyethylene naphthalate (PEN); cellulose esters and derivatives thereof, such as polyethylene, polypropylene, cellophane, cellulose diacetate, cellulose triacetate (TAC), cellulose acetate butyrate, cellulose acetate propionate (CAP), cellulose acetate phthalate, and cellulose nitrate; and cycloolefin resins, such as poly(vinylidene chloride), poly(vinyl alcohol), polyethylene vinyl alcohol, syndiotactic polystyrene, polycarbonates (PC), norbornene resins, polymethylpentene, polyetherketone, polyimide, polyethersulfone (PES), poly(phenylene sulfide), polysulfone, polyetherimide, poly(ether ketone imide), polyamide, fluorinated resins, nylon, poly(methylmethacrylate), acrylic resins, polyarylate, ARTON (trade name, JSR Corporation), and APEL (trade name, Mitsui Chemicals, Inc.).

Among these resins, resins available at a low cost, such as poly(ethylene terephthalate) (PET), poly(butylene terephthalate), poly(ethylene naphthalate) (PEN), and polycarbonates (PC), are preferred for making the flexible resin substrate.

The resin substrate of the present invention has a thickness in the range of 3 to 50 μm, preferably 3 to 35 μm, more preferably 3 to 30 μm, and particularly preferably 10 to 30 μm.

The resin substrate of the present invention typically resides on a light emitting side of the organic EL device, and thus should be transparent. Light emission from the resin substrate side can be achieved with a transparent resin substrate and highly transmissive layers, such as a transparent anode, on or above the resin substrate. Such a resin substrate can also be suitably used as the sealing member (or a transparent substrate) for the organic EL device. The resin substrate may be either an unstretched or stretched film.

The resin substrate of the present invention can be made by a common traditional method of making a film. Examples of such a method include melt casting methods involving melting a resin material in an extruder, rapidly cooling by extrusion with a cyclic die or T-die to make a substantially unoriented unstretched amorphous resin substrate, and solution casting methods involving dissolving a resin material in a solvent and making a film. A stretched resin substrate can be made by stretching an unstretched resin substrate in a traveling direction of the unstretched resin substrate (a longitudinal or MD direction) or in a direction orthogonal to the traveling direction (a lateral or TD direction). In this method, a draw ratio can be determined based on a resin material for the resin substrate. Preferably, the draw ratio is in the range of 2 to 10 both in the longitudinal and lateral directions.

In the case of forming the gas barrier layer, a hydrophilization treatment, such as a corona treatment, can be performed on the surface of the resin substrate, in advance to the formation of a precursor layer of the gas barrier layer, e.g., a polysilazane-containing layer.

<Use of Supporting Film>

The method of producing the organic EL device of the present invention uses a thin resin substrate having a thickness in the range of 3 to 50 μm. The thin resin substrate is readily deformed or broken during the production of the organic EL device, and thus is difficult to handle. In forming each layer on or above such a resin substrate, it is important to ensure flatness at each level, and thus tension should be applied to the two ends of the transparent substrate. Since the transparent substrate is thin and has insufficient hardness, the applied tension causes displacement or wrinkles, and consequently, layers cannot be accurately and uniformly formed.

In the present invention, a supporting film is preferably used to solve this problem. The supporting film is temporary used during the production of the flexible organic EL device, and is removed from the transparent substrate after forming functional layers on or above the transparent substrate.

Examples of a resin material usable for making the supporting film include the resins described above as the resin materials for the resin substrate of the present invention.

The supporting film can have any thickness, preferably, has a thickness in the range of 50 to 300 μm, in view of its mechanical strength and manageability. The thickness of the supporting film can be measured with a micrometer.

Examples of a method of putting the supporting film on the resin substrate of the present invention include methods involving providing an adhesion layer between the resin substrate and the supporting film and compressing with, for example, a feed roller, and methods involving depositing the supporting film on the resin substrate and generating a difference in potential between the supporting film and the resin substrate under vacuum to generate an electric charge and adhere the film to the substrate. In this method involving electrical charging and adhesion, the supporting film and the resin substrate are charged to have electric charges opposite to each other to electrostatically adhere them. After the production of the organic EL device, a neutralization treatment is performed on the organic EL device to remove the supporting film from the resin substrate.

(Transparent Anode)

The transparent anode of the present invention is primarily composed of silver and has a thickness in the range of 2 to 20 nm. Preferably, the transparent anode of the present invention is formed on or above the underlying layer containing at least a nitrogen or sulfur atom-containing organic compound.

In the organic EL device (ELD) illustrated in FIG. 1B, the transparent anode (4) substantively functions as an anode. The organic EL device (ELD) is a bottom emission-type device where light passes through the transparent anode (4) and is emitted from the side of the thin resin substrate (1).

Thus, the transparent anode (4) should be composed of a transmissive conductive layer.

In the present invention, the transparent anode primarily composed of silver is a layer that contains 60 wt % or more silver, preferably 80 wt % or more silver, more preferably 90 wt % or more silver, particularly preferably 98 wt % or more silver. The light transmittance at 550 nm of the "transparent" anode of the present invention is 50% or more.

The transparent anode is primarily composed of silver, and may consist of silver or be composed of an alloy containing silver (Ag). Examples of such an alloy include silver-magnesium (Ag—Mg) alloys, silver-copper (Ag—Cu) alloys, silver-palladium (Ag—Pd) alloys, silver-palladium-copper (Ag—Pd—Cu) alloys, and silver-indium (Ag—In) alloys.

The transparent anode of the present invention may be composed of multiple layers primarily composed of silver.

In general, a transparent anode can be formed by a wet process, for example, application, ink-jetting, coating, or dipping, or by a dry process, for example, deposition (e.g., resistive heating or EB deposition), sputtering, or CVD. In the method of producing the organic EL device of the present invention, the transparent anode is formed by deposition.

In the present invention, vacuum deposition can be typically used. In vacuum deposition, a resistive heating crucible is placed in a vacuum deposition device, and material for the transparent anode, such as silver, and/or an alloy as needed, is placed in the crucible. The resistive heating crucible for vacuum deposition is composed of molybdenum or tungsten. To form the transparent anode, a degree of vacuum in the vacuum deposition device is decreased to $1 \times 10^{-2}$ to $1 \times 10^{-6}$ Pa. Subsequently, a current is applied to the resistive heating crucible containing the material for the transparent anode, such as silver, to heat the material, and then silver is deposited at a predetermined rate (nm/sec) on the resin substrate or the underlying layer to form a thin silver layer. The transparent anode having a thickness in the range of 2 to 20 nm is thereby formed.

The transparent anode formed on the underlying layer has sufficient conductivity without annealing at a high temperature (e.g., heating at 150° C. or more) after the formation of the anode. If needed, such annealing can be performed at a temperature causing no deformation of the resin substrate after the formation of the transparent electrode.

The transparent anode of the present invention has a thickness in the range of 2 to 20 nm, preferably 4 to 12 nm. A thickness of 20 nm or less is preferred to reduce the amounts of a light-absorbing component and light-reflecting component in the transparent anode, and a thickness of 2 nm or more is preferred to provide the transparent anode with sufficient conductivity.

(Underlying Layer)

The organic EL device of the present invention preferably includes an underlying layer on a side of the transparent anode, the side being adjacent to the resin substrate, and the underlying layer containing at least a nitrogen or sulfur atom-containing organic compound. Preferably, the organic compound contained in the underlying layer contains a nitrogen atom having an effective unshared electron pair which is not involved in aromaticity.

In the present invention, the underlying layer containing a nitrogen or sulfur atom-containing organic compound is formed, and then the transparent anode primarily composed of silver is formed on the underlying layer. In the formation of the transparent anode, silver atoms in the transparent anode interact with the nitrogen or sulfur atom(s) contained in the organic compound in the underlying layer. Such interaction reduces the diffusion distance of the silver atoms on the surface of the underlying layer and thus prevents local agglomeration of the silver atoms. Hence, a highly uniform transparent anode can be formed.

In general, the formation of a transparent anode primarily composed of silver involves insular growth (Volumer-Weber or VW growth) and thus ready formation of separate islands of silver particles. When a transparent anode is thin, such a transparent anode barely has conductivity and has a high sheet resistance. To ensure sufficient conductivity, the thickness of a transparent anode should be increased to some extent, but such an increase in the thickness decreases the light transmittance of a transparent anode, and thus inadequate for a transparent electrode.

To solve this problem, in the present invention, the underlying layer containing a nitrogen or sulfur atom-containing organic compound is formed prior to the formation of the transparent anode. The interaction of nitrogen or sulfur atoms with silver atoms prevents local agglomeration of the silver atoms. Hence, the formation of the transparent anode primarily composed of silver involves laminar growth (Frank-van der Merwe or FM growth).

The underlying layer of the present invention is primarily composed, at least, of a nitrogen or sulfur atom-containing organic compound. In the present invention, the underlying layer primarily composed of a nitrogen or sulfur atom-containing organic compound contains such an organic compound in a weight ratio of 50 wt % or more, preferably 70 wt % or more.

In the present invention, one or more of such organic compounds can be used. Other compounds that contain no nitrogen atom or sulfur atom can also be used, provided that such other compounds do not impair advantageous effects of the present invention.

The underlying layer of the present invention may have a thickness in the range of 5 nm to 1 μm, preferably 10 to 500 nm to ensure the uniformity of the transparent conductive layer containing silver.

The organic compound(s) used in the present invention can be either or both of a low-molecular-weight compound and polymer compound.

<Nitrogen Atom-Containing Low-Molecular-Weight Organic Compound>

The nitrogen atom-containing low-molecular-weight organic compound usable in the present invention preferably has a melting point of 80° C. or more and a molecular weight M in the range of 150 to 1200, and strongly interacts with silver or the like. Preferred low-molecular-weight organic compounds include nitrogen-containing heterocyclic ring compounds and phenyl group-substituted amine compounds.

The rate of the number n of the [effective unshared electron pair(s)] to the molecular weight M of the nitrogen atom-containing organic compound used in the present invention is defined as an "effective unshared electron pair content rate" [n/M]. The nitrogen atom-containing low-molecular-weight organic compound has a [n/M] of $2.0 \times 10^{-3}$ or more, preferably $3.9 \times 10^{-3}$ or more.

The effective unshared electron pair described herein is an unshared electron pair of a nitrogen atom contained in the compound, the pair which is not involved in aromaticity and has no coordination to a metal.

The aromaticity described herein denote an unsaturated cyclic structure where atoms having on pair of a nist in a cyclic line, i.e., the aromaticity complying with Hückel's rule. According to the characteristics, the number of electrons in a π-electron system is "4n+2" (n is zero or a natural number).

If an unshared electron pair of a nitrogen atom is not involved in aromaticity, such an electron pair is determined as the [effective unshared electron pair] described above, regardless of whether a nitrogen atom having such an unshared electron pair is a heteroatom of an aromatic ring. That is, if a nitrogen atom that is a heteroatom of an aromatic ring has an unshared electron pair which is not involved in aromaticity, such an unshared electron pair is defined as the [effective unshared electron pair].

In contrast, if a nitrogen atom that is not a heteroatom of an aromatic ring has an unshared electron pair involved in aromaticity, such an unshared electron pair of a nitrogen atom is not defined as the [effective unshared electron pair].

In each compound, the number n of the [effective unshared electron pair (s)] is equal to the number of the nitrogen atom(s) having the [effective unshared electron pair].

When multiple nitrogen atom-containing organic compounds are used, the molecular weight M of a mixture of these compounds is calculated based on, for example, a mixing ratio of these compounds, and the sum of the numbers n of the [effective unshared electron pairs] is divided by this molecular weight M to calculate an average effective unshared electron pair content rate [n/M]. This average preferably takes the preferred value described above.

The following compounds Nos. 1 to 43 are examples of the nitrogen atom-containing low-molecular-weight organic compound used for the underlying layer and having an effective unshared electron pair content rate [n/M] of $2.0 \times 10^{-3}$ or more.

In exemplary compound No. 31, i.e., copper phthalocyanine, unshared electron pairs having no coordination to copper are the [effective unshared electron pairs] among the unshared electron pairs of a nitrogen atom.

[Chem. 1]

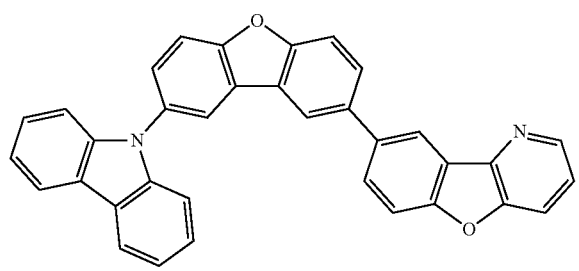

No.1

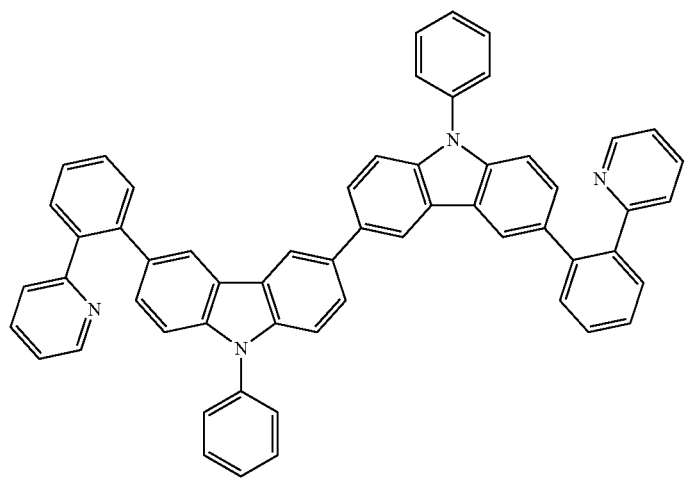

No.2

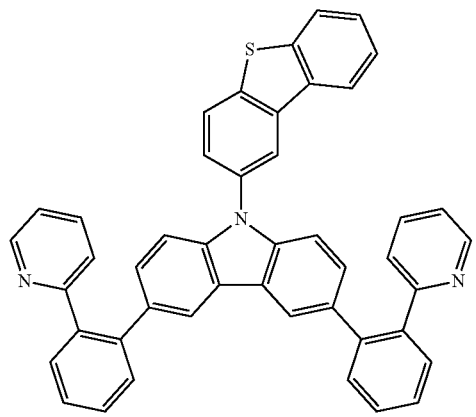

No.3

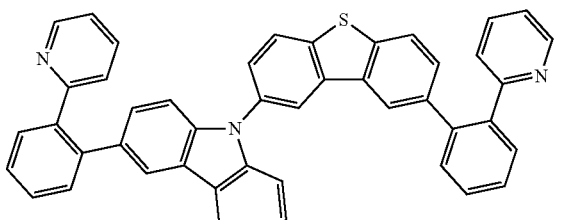

No.4

-continued
No.5
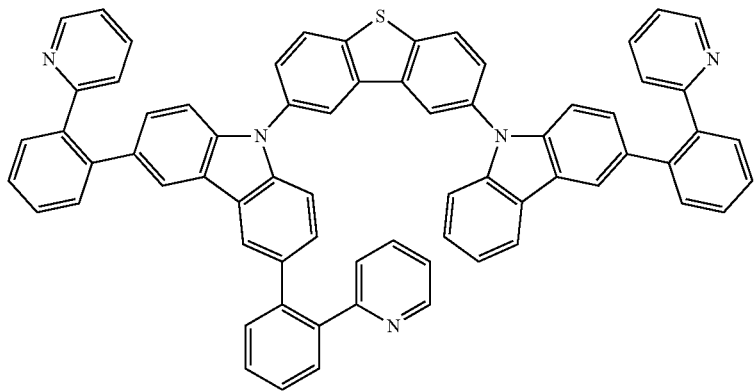
No.6
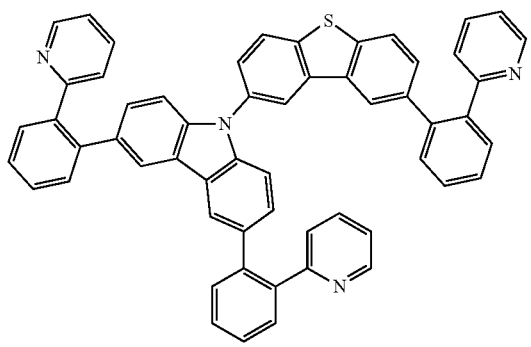
No.7
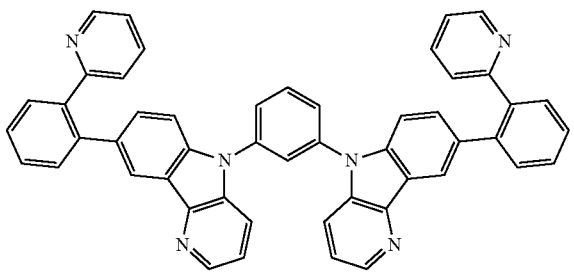
[Chem. 2]
No.8
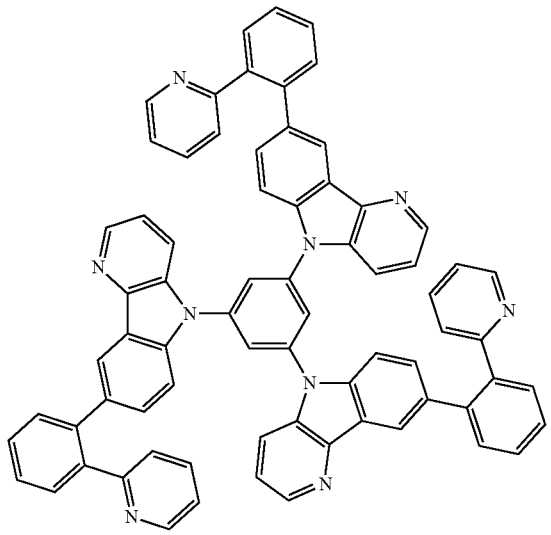
No.9
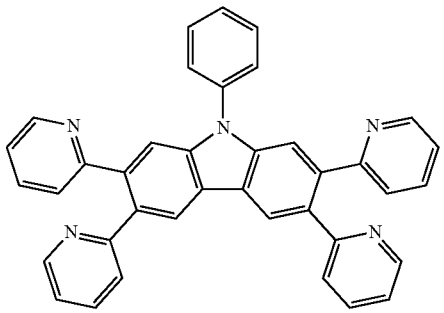

-continued
No.10
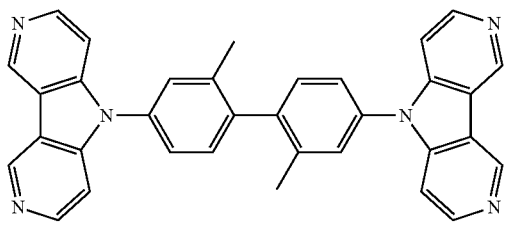
No.11
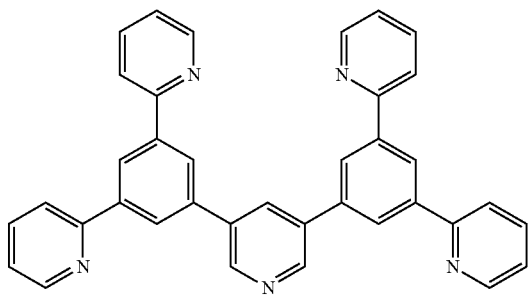
No.12
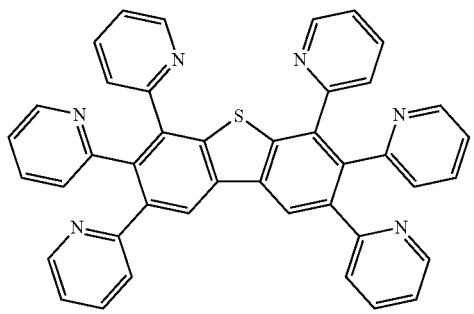
No.13
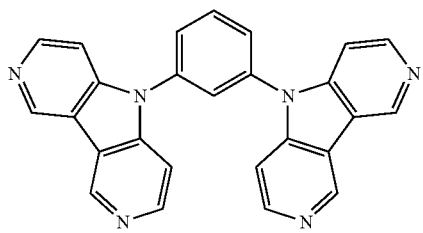
No.14
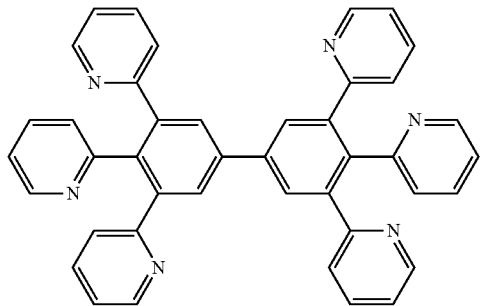
No.15
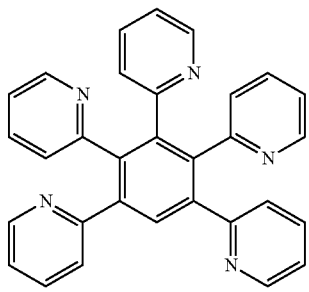
No.16
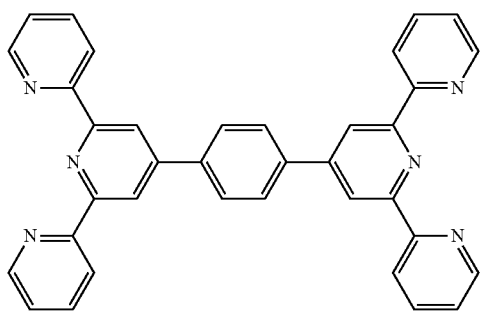
[Chem. 3]
No.17
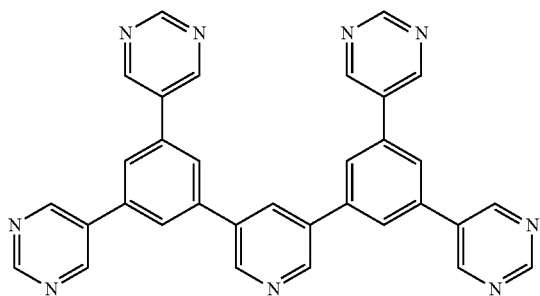
No.18
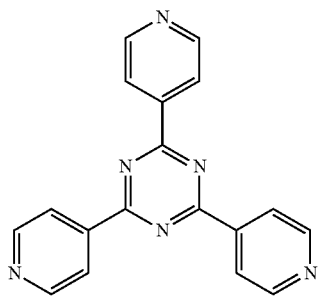

-continued
No.19
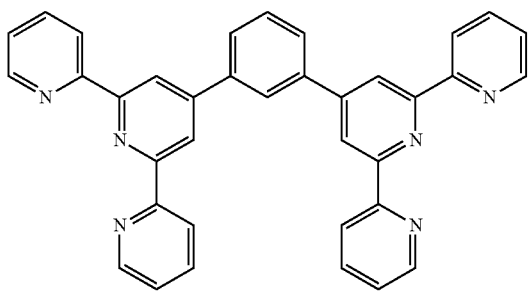
No.20
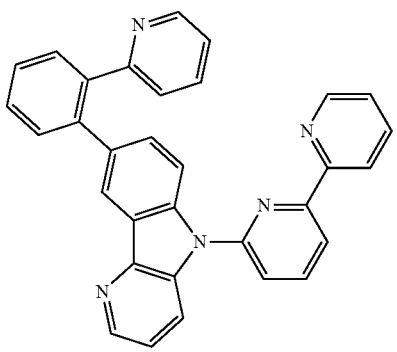
No.21
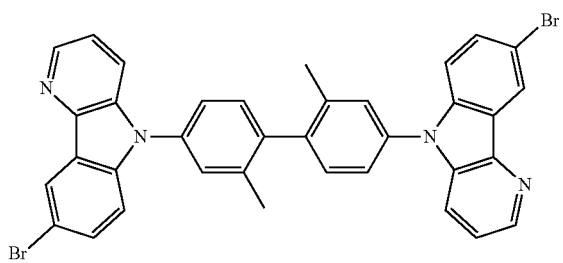
No.22
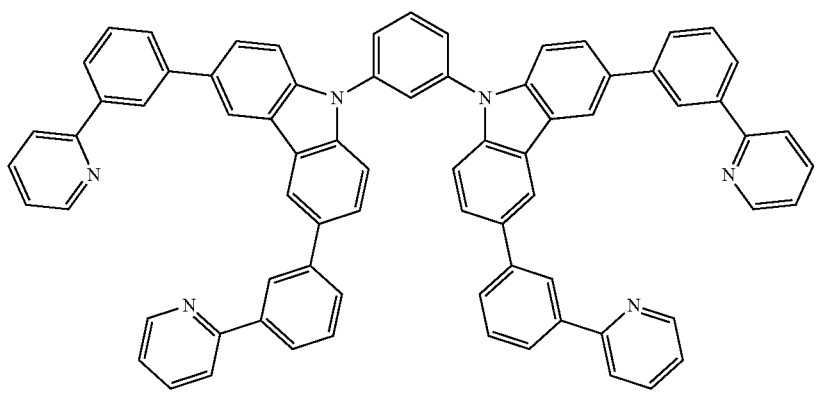
No.23
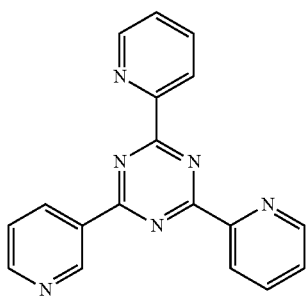
[Chem. 4]
No.24
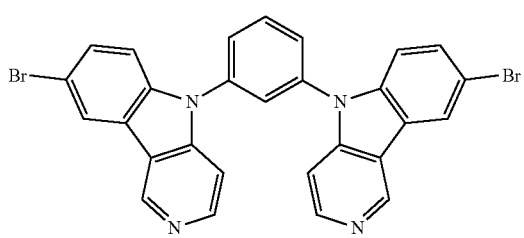
No.25
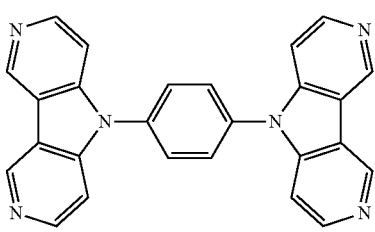

-continued
No.26
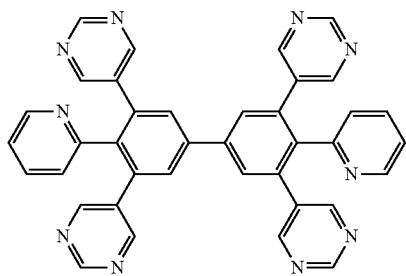
No.27
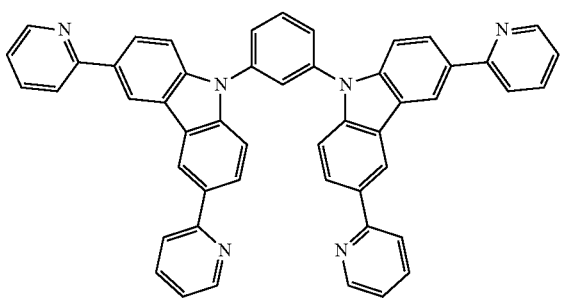
No.28
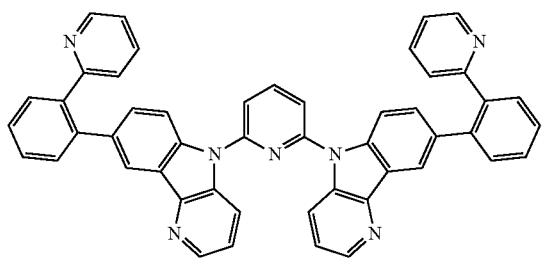
No.29
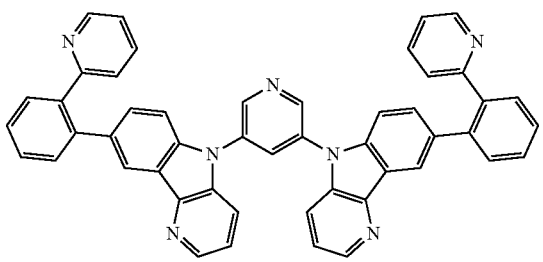
No.30
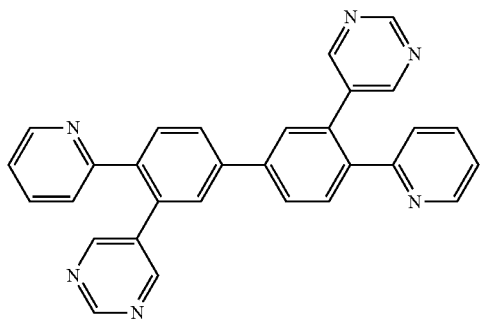
No.31
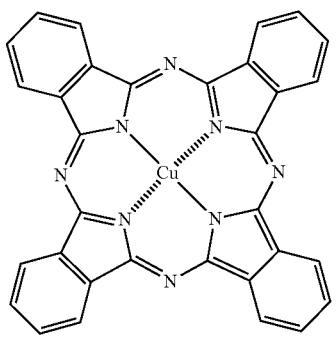
No.32
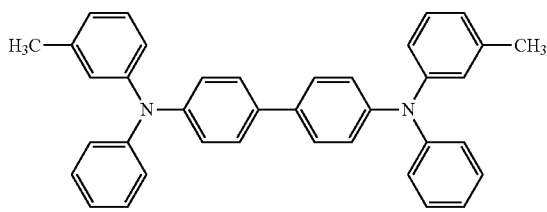
No.33
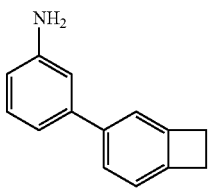
[Chem. 5]
No.34
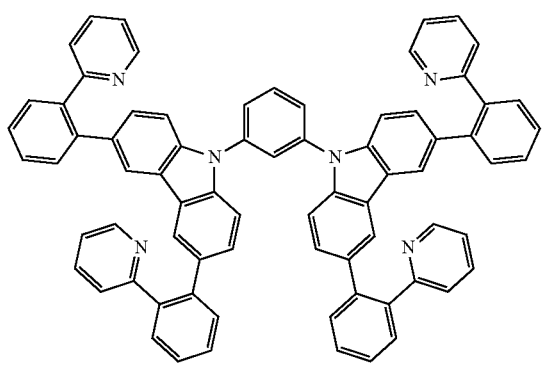
No.35
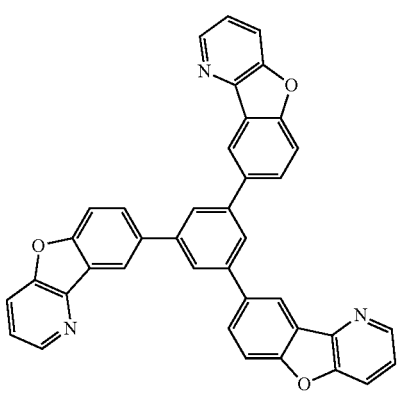

-continued
No.36
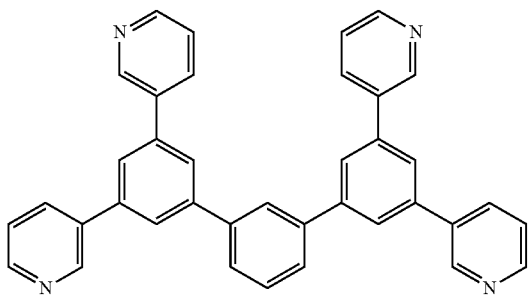
No.37
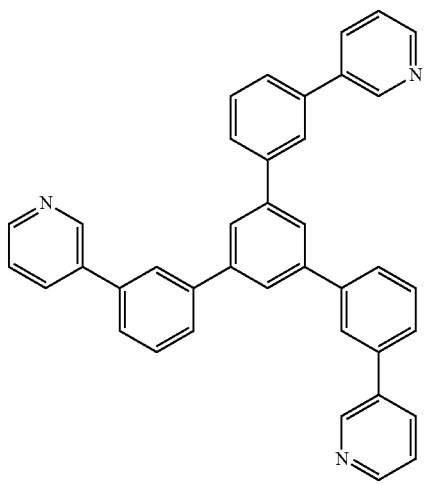
No.38
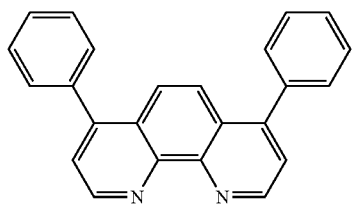
[Chem. 6]
No.39
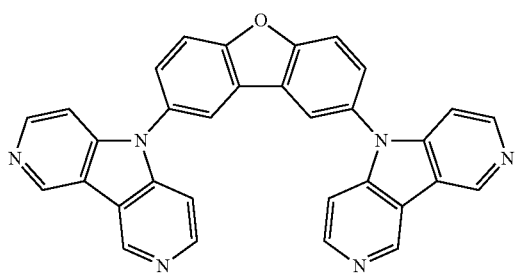
No.40
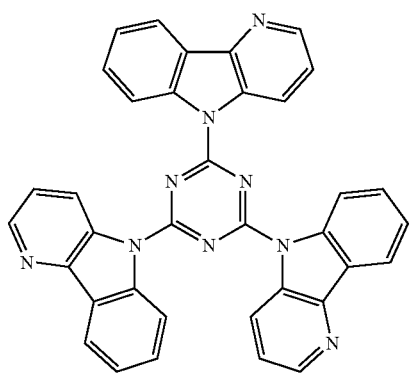
No.41
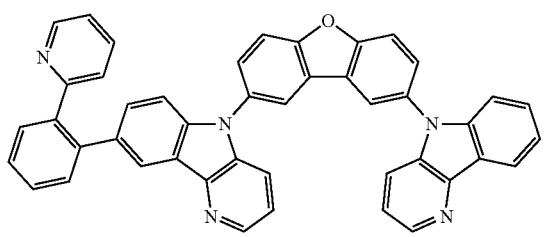
No.42
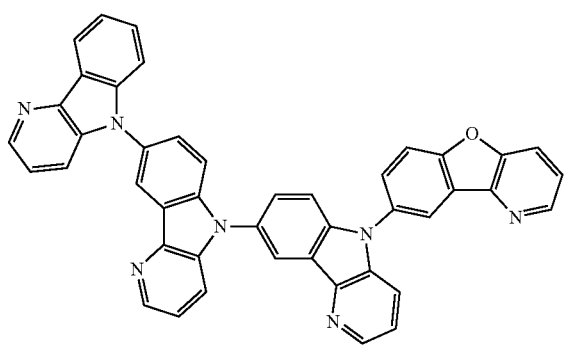

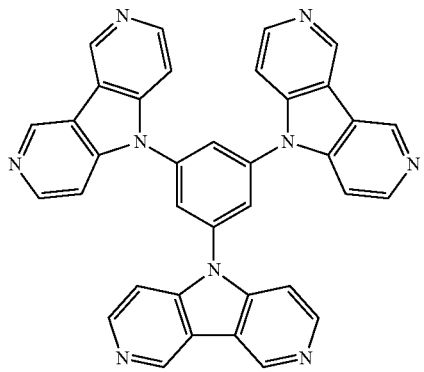

No.43

The number of [effective unshared electron pairs] (n), molecular weight (M), and effective unshared electron pair content rate [n/M] of exemplary compounds Nos. 1 to 43 described above are shown below.

In addition to compounds Nos. 1 to 43, examples of the nitrogen atom-containing low-molecular-weight organic compound include following compounds Nos. 44 to 47.

[Chem. 7]

TABLE 1

| EXEMPLARY COMPOUND NO. | NUMBER OF EFFECTIVE UNSHARED ELECTRON PAIRS | MOLECULAR WEIGHT (M) | EFFECTIVE UNSHARED ELECTRON PAIR CONTENT RATE (n/M) |
|---|---|---|---|
| No. 1 | 1 | 500.55 | 0.0020 |
| No. 2 | 2 | 790.95 | 0.0025 |
| No. 3 | 2 | 655.81 | 0.0030 |
| No. 4 | 2 | 655.81 | 0.0030 |
| No. 5 | 3 | 974.18 | 0.0031 |
| No. 6 | 3 | 808.99 | 0.0037 |
| No. 7 | 4 | 716.83 | 0.0056 |
| No. 8 | 6 | 1036.19 | 0.0058 |
| No. 9 | 4 | 551.64 | 0.0073 |
| No. 10 | 4 | 516.60 | 0.0077 |
| No. 11 | 5 | 539.63 | 0.0093 |
| No. 12 | 6 | 646.76 | 0.0093 |
| No. 13 | 4 | 412.45 | 0.0097 |
| No. 14 | 6 | 616.71 | 0.0097 |
| No. 15 | 5 | 463.53 | 0.0108 |
| No. 16 | 6 | 540.62 | 0.0111 |
| No. 17 | 9 | 543.58 | 0.0166 |
| No. 18 | 6 | 312.33 | 0.0192 |
| No. 19 | 6 | 540.62 | 0.0111 |
| No. 20 | 4 | 475.54 | 0.0084 |
| No. 21 | 2 | 672.41 | 0.0030 |
| No. 22 | 4 | 1021.21 | 0.0039 |
| No. 23 | 6 | 312.33 | 0.0192 |
| No. 24 | 2 | 568.26 | 0.0035 |
| No. 25 | 4 | 412.45 | 0.0097 |
| No. 26 | 10 | 620.66 | 0.0161 |
| No. 27 | 4 | 716.63 | 0.0056 |
| No. 28 | 5 | 717.82 | 0.0070 |
| No. 29 | 5 | 717.82 | 0.0070 |
| No. 30 | 6 | 464.52 | 0.0129 |
| No. 31 | 4 | 576.10 | 0.0069 |
| No. 32 | 2 | 516.67 | 0.0039 |
| No. 33 | 1 | 195.26 | 0.0051 |
| No. 34 | 4 | 1021.21 | 0.0039 |
| No. 35 | 3 | 579.60 | 0.0052 |
| No. 36 | 4 | 538.64 | 0.0074 |
| No. 37 | 3 | 537.65 | 0.0056 |
| No. 38 | 2 | 332.40 | 0.0060 |
| No. 39 | 4 | 502.15 | 0.0080 |
| No. 40 | 6 | 579.19 | 0.0104 |
| No. 41 | 3 | 653.22 | 0.0046 |
| No. 42 | 4 | 667.21 | 0.0060 |
| No. 43 | 6 | 579.19 | 0.0104 |

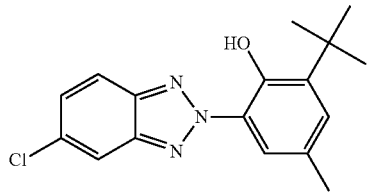

No.44

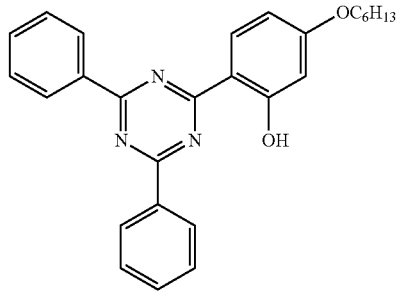

No.45

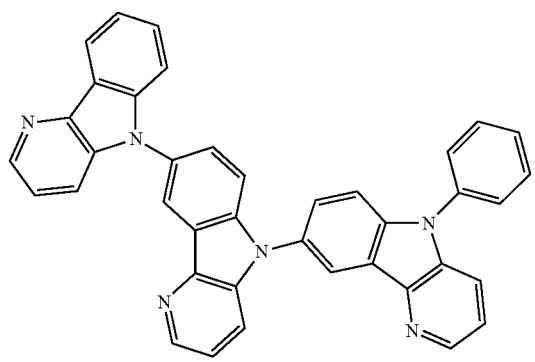

No.46

No.47

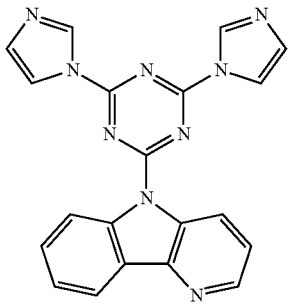

<Nitrogen Atom-Containing Polymer>

In the present invention, a polymer can be used as the nitrogen atom-containing organic compound suitable for the underlying layer.

Preferably, the nitrogen-containing polymer usable in the present invention has a weight-average molecular weight in the range of 1000 to 1000000.

Any polymer can be used in the present invention. Preferred polymers have a substructure(s) represented by the following general formula(e) (P1) and/or (P2).

[Chem. 8]

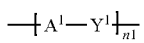

General formula (P1)

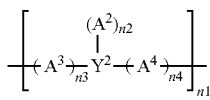

General formula (P2)

In general formula (P1), $A^1$ represents a nitrogen atom-containing divalent group, $Y^1$ represents a divalent organic group or a single bond, and n1 represents the repetition number in the range of 1000 to 1000000.

In general formula (P2), $A^2$ represents a nitrogen-containing monovalent group, n2 represents an integer of 1 or more, preferably in the range of 1 to 3, more preferably 1 or 2 to facilitate its production. When n2 is 2 or more, $A^2$s may be the same or different from each other. When multiple $A^2$s are contained in a polymer, $A^2$s may be the same or different from each other.

In general formula (P2), $A^3$ and $A^4$ each represent a nitrogen-containing divalent group, and may be the same or different from each other, and n3 and n4 each independently represent an integer of 0 or 1.

In general formula (P2), $Y^2$ represents an (n2+2)-valent organic group.

The nitrogen-containing polymer having the substructure(s) represented by general formula(e) (P1) and/or (P2) may be a homopolymer composed solely of a unit represented by general formula (P1) or (P2), and may be a copolymer composed of two or more units represented by general formula (e) (P1) and/or (P2).

The nitrogen-containing polymer may be a copolymer that includes, in addition to the unit (s) represented by general formula (P1) or (P2), a different unit(s) containing no nitrogen-containing substituent (hereinafter also referred simply to as a "different unit").

When the nitrogen atom-containing polymer used in the present invention includes the different unit(s) containing no nitrogen atom, the content of the different unit (s) may take any value such that the different unit(s) do not impair the effects of the nitrogen-containing polymer used in the present invention. The content percentage of a monomer(s) of the different unit(s) to the monomers of all types of the units is in the range of 10 to 75 mol %, preferably 20 to 50 mol %.

The terminus of the polymer having the substructure(s) represented by general formula(e) (P1) and/or (P2) may have any atom and determined based on material (monomer) to be used, and typically is a hydrogen atom.

In general formula (P2), the nitrogen atom-containing monovalent group represented by $A^2$ may be any nitrogen atom-containing organic group. Examples include amino groups, dithiocarbamate groups, thioamide group, cyano group (—CN), isonitrile group (—N$^+$≡groupisocyanato group (—N═C═O), thioisocyanate group (—N═C═S), or groups containing a substituted or unsubstituted nitrogen-containing aromatic ring(s).

Examples of the nitrogen atom-containing monomeric unit of the polymer are described below, but the present invention should not be limited to the use of these monomers. The nitrogen atom-containing polymer of the present invention is composed of a repeated following monomeric unit (s) and has a weight-average molecular weight of 1000 to 1000000.

[Chem. 9]

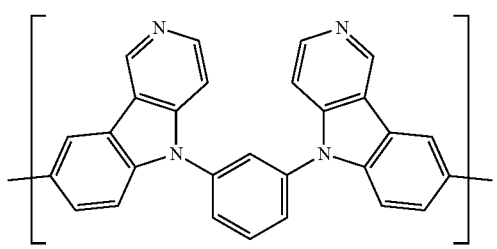

PN1

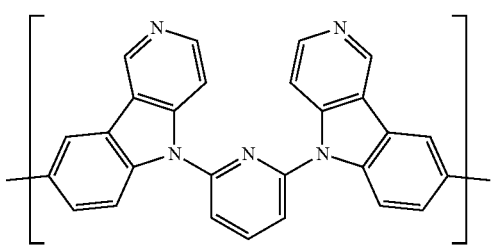

PN2

-continued
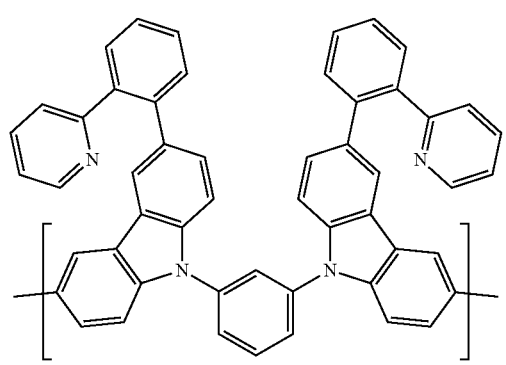
PN3
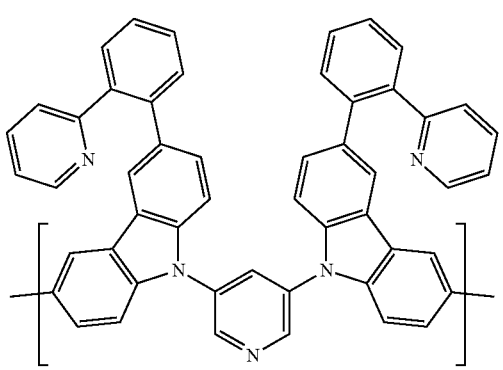
PN4
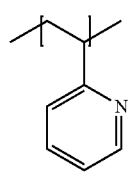
PN5
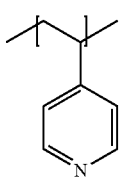
PN6
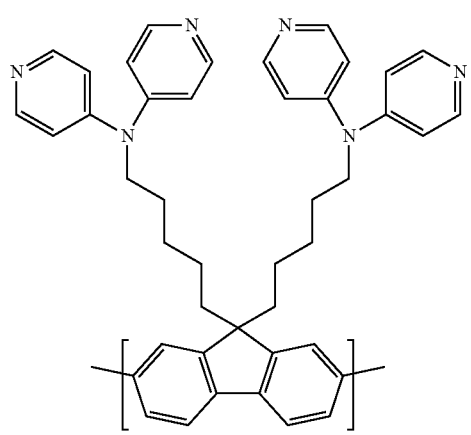
PN7
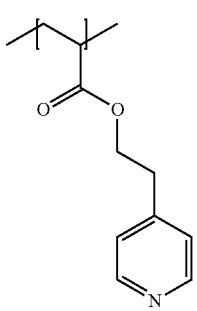
PN8
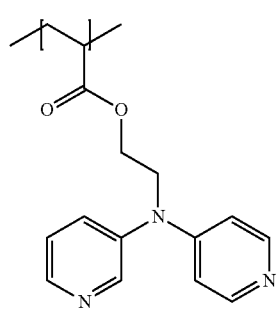
PN9
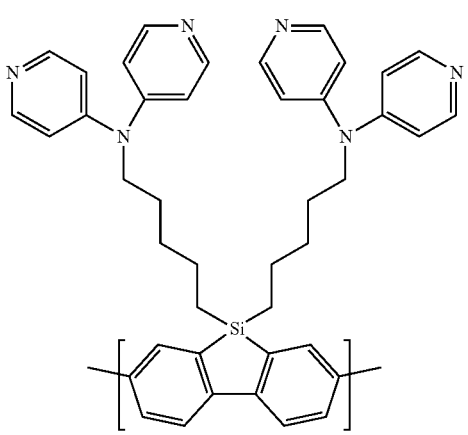
PN10

[Chem. 10]
PN11
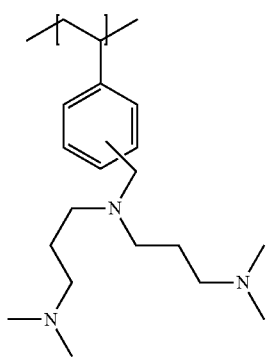
PN12
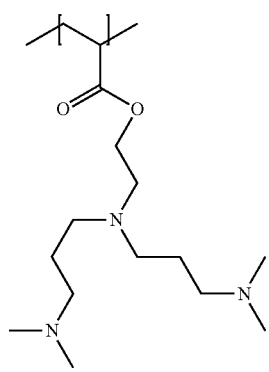
PN13
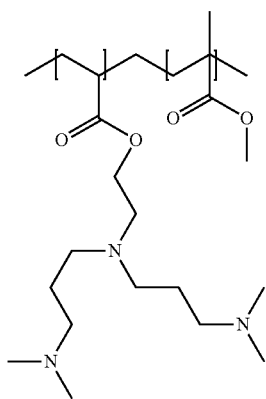
PN14
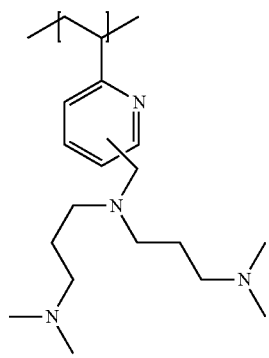
PN15
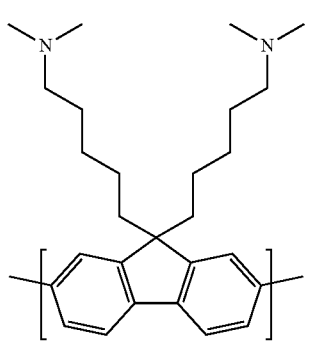
PN16
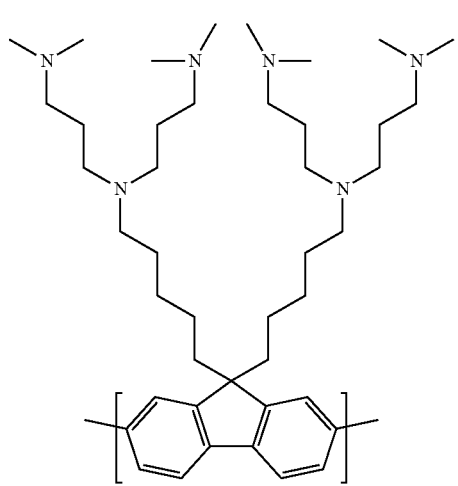

-continued
PN17 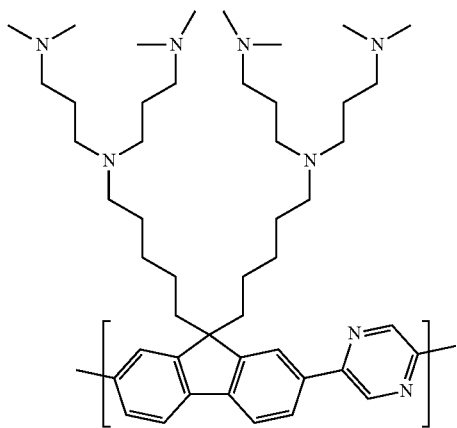 PN18 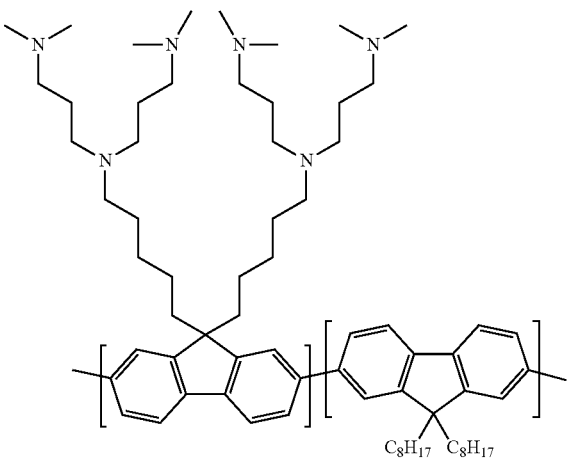
PN19 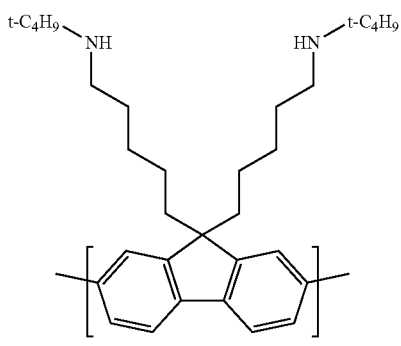 PN20 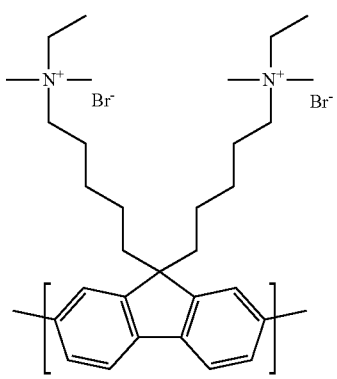
[Chem. 11]
PN21 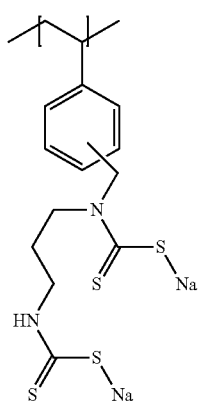 PN22 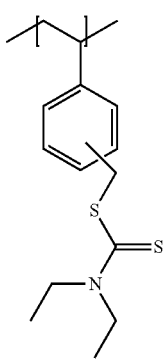

-continued
PN23
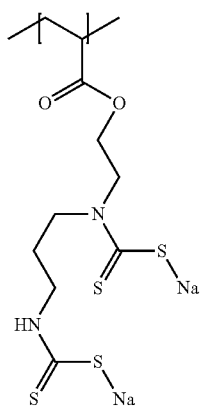
PN24
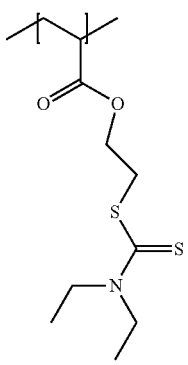
PN25
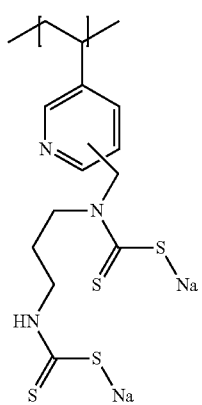
PN26
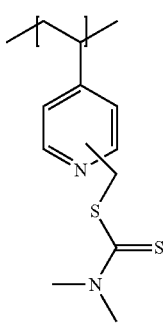
PN27
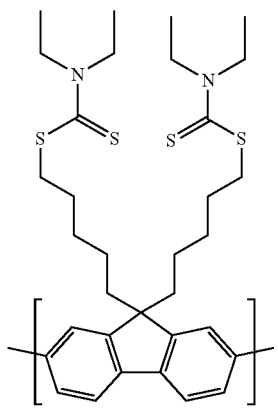
PN28
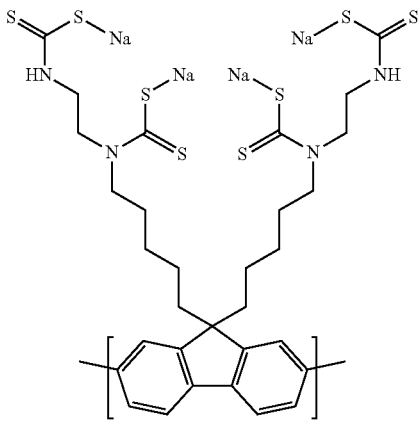
PN29
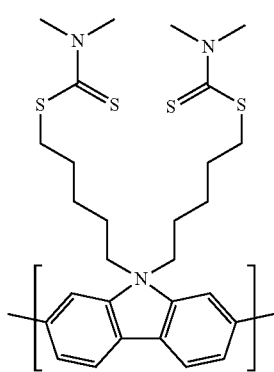
PN30
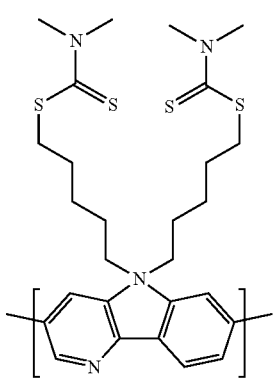

-continued
[Chem. 12]
PN31 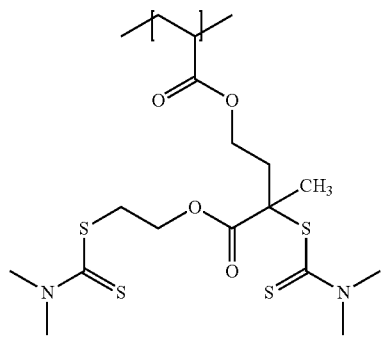
PN32 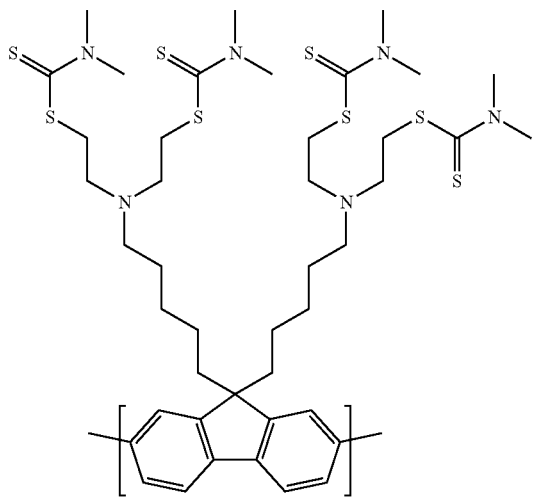
PN33 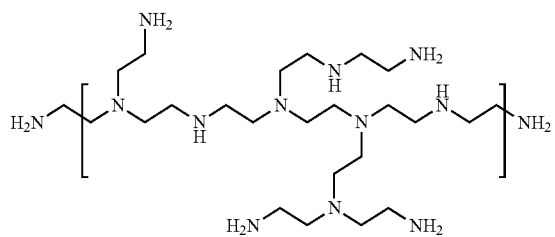
PN34 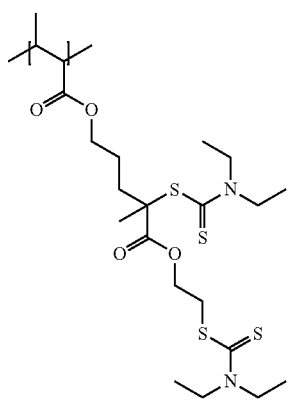
[Chem. 13]
PN35 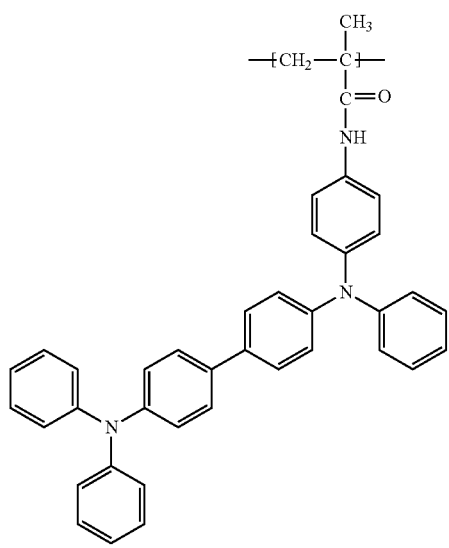
PN36 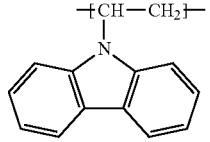

PN37 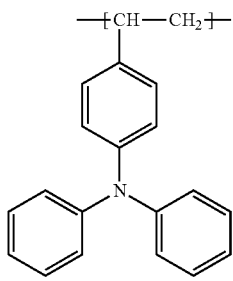

PN38 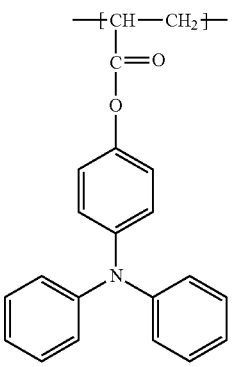

PN39 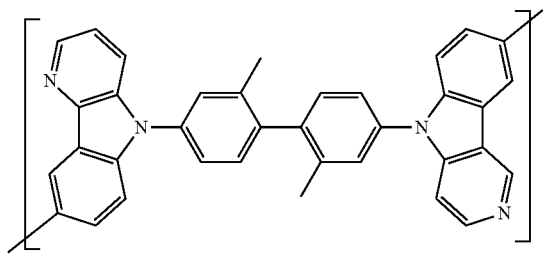

PN40 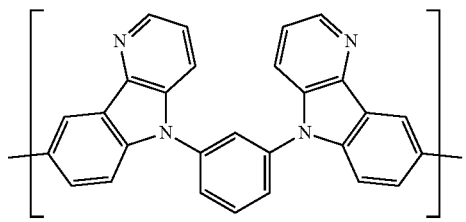

PN41 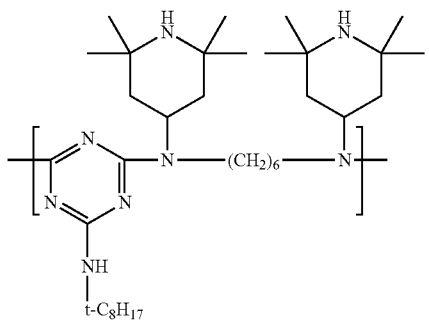

<Sulfur Atom-Containing Organic Compound>

A sulfur atom-containing organic compound usable in the present invention may be any organic compound containing a sulfide bond (or thioether bond), disulfide bond, mercapto group, sulfone group, and/or thiocarbonyl bond in the molecule. Preferably, a sulfide bond and mercapto group are contained.

Examples of the sulfur atom-containing organic compound include sulfur-containing compounds represented by general formulae (1) to (4) below.

[Chem. 14]

$$R_1-S-R_2 \quad \text{General formula (1)}$$

[Chem. 15]

$$R_3-S-S-R_4 \quad \text{General formula (2)}$$

[Chem. 16]

$$R_5-S-H \quad \text{General formula (3)}$$

[Chem. 17]

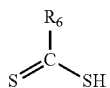

General formula (4)

In general formula (1), $R_1$ and $R_2$ each represent a substituent.

Examples of the substituents represented by $R_1$ and $R_2$ include: alkyl groups (e.g., methyl, ethyl, propyl, isopropyl, tert-butyl, pentyl, hexyl, octyl, dodecyl, tridecyl, tetradecyl, and pentadecyl groups); cycloalkyl groups (e.g., cyclopentyl and cyclohexyl groups); alkenyl groups (e.g., vinyl and allyl groups); alkynyl groups (e.g., ethynyl and propargyl groups); aromatic hydrocarbon groups (also referred to as aromatic carbocyclic ring groups or aryl groups, such as phenyl, p-chlorophenyl, mesityl, tolyl, xylyl, naphthyl, anthryl, azulenyl, acenaphthenyl, fluorenyl, phenanthryl, indenyl, pyrenyl, and biphenylyl groups); aromatic heterocyclic ring groups (e.g., furyl, thienyl, pyridyl, pyridazinyl, pyrimidinyl, pyrazinyl, triazinyl, imidazolyl, pyrazolyl, thiazolyl, quinazolinyl, carbazolyl, carbolinyl, diazacarbazolyl (i.e., groups where a carbon atom of a carboline ring of the carbolinyl group is replaced with a nitrogen atom), and phthalazinyl groups); heterocyclic groups (e.g., pyrrolidyl, imidazolidyl, morpholyl, and oxazolidyl groups); alkoxy groups (e.g., methoxy, ethoxy, propyloxy, pentyloxy, hexyloxy, octyloxy, and dodecyloxy groups); cycloalkoxy groups (e.g., cyclopentyloxy and cyclohexyloxy groups); aryloxy groups (e.g., phenoxy and naphthyloxy groups); alkylthio groups (e.g., methylthio, ethylthio, propylthio, pentylthio, hexylthio, octylthio, and dodecylthio groups); cycloalkylthio groups (e.g., cyclopentylthio and cyclohexylthio groups); arylthio groups (e.g., phenylthio and naphthylthio groups); alkoxycarbonyl groups (e.g., methyloxycarbonyl, ethyloxycarbonyl, butyloxycarbonyl, octyloxycarbonyl, and dodecyloxycarbonyl groups); aryloxycarbonyl groups (e.g., phenyloxycarbonyl and naphthyloxycarbonyl groups); sulfamoyl groups (e.g., aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups); acyl groups (e.g., acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups); acyloxy groups (e.g., acetyloxy, ethylcarbonyloxy, butylcarbonyloxy, octylcarbonyloxy, dodecylcarbonyloxy, and phenylcarbonyloxy groups); amido groups (e.g., methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups); carbamoyl groups (e.g., aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups); ureido groups (e.g., methylureido, ethylureido, pentylureido, cyclohexylureido, octylureido, dodecylureido, phenylureido, naphthylureido, and 2-pyridylaminoureido groups); sulfinyl groups (e.g., methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups); alkylsulfonyl groups (e.g., methylsulfonyl, ethylsulfonyl, butylsulfonyl, cyclohexylsulfonyl, 2-ethylhexylsulfonyl, and dodecylsulfonyl groups); arylsulfonyl and heteroarylsulfonyl groups (e.g., phenylsulphonyl, naphthylsulfonyl, and 2-pyridylsulfonyl groups); amino groups (e.g., amino, ethylamino, dimethylamino, butylamino, cyclopentylamino, 2-ethylhexylamino, dodecylamino, anilino, naphthylamino, 2-pyridylamino, piperidyl (or piperidinyl), and 2,2,6,6-tetramethylpiperidinyl groups); halogen atoms (e.g., fluorine, chlorine, and bromine atoms); fluorinated hydrocarbon groups (e.g., fluoromethyl, trifluoromethyl, pentafluoroethyl, and pentafluorophenyl groups); a cyano group; a nitro group; a hydroxy group; a mercapto group; silyl groups (e.g., trimethylsilyl, triisopropylsily, triphenylsilyl, and phenyldiethylsilyl groups); phosphate ester groups (e.g., dihexylphosphoryl group); phosphite ester groups (e.g., diphenylphosphinyl group); and phosphono groups.

In general formula (2), $R_3$ and $R_4$ each represent a substituent.

Examples of the substituents represented by $R_3$ and $R_4$ include those represented by $R_1$ and $R_2$ of general formula (1).

In general formula (3), $R_5$ represents a substituent.

Examples of the substituent represented by $R_5$ include those represented by $R_1$ and $R_2$ of general formula (1).

In general formula (4), $R_6$ represents a substituent.

Examples of the substituent represented by $R_6$ include those represented by $R_1$ and $R_2$ of general formula (1).

Examples of the sulfur atom-containing organic compound usable for the underlying layer of the present invention include the following compounds.

[Chem 18]

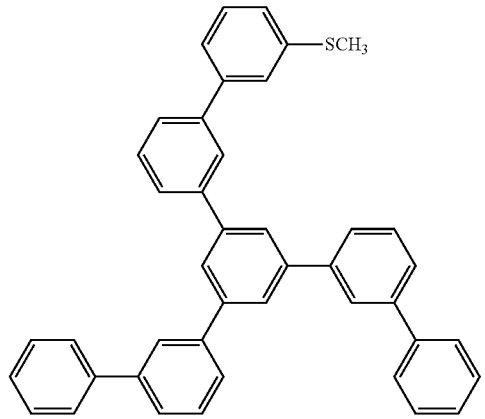

1-1

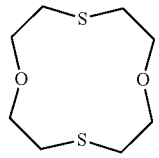

1-2

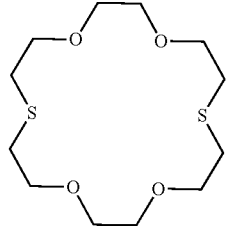

1-3

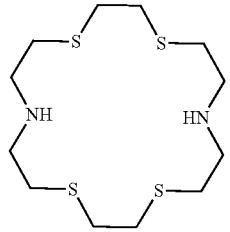

1-4

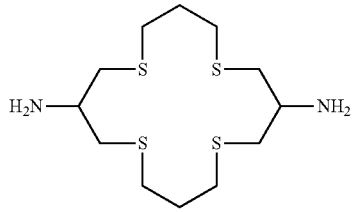

1-5

-continued
1-6
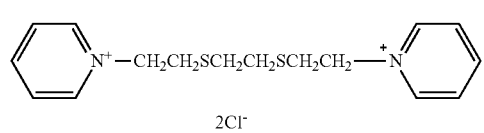
1-7
1-8
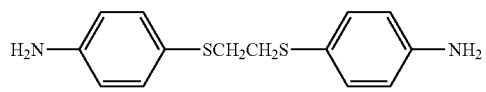
1-9
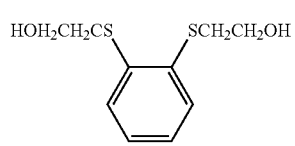
[Chem. 19]
2-1
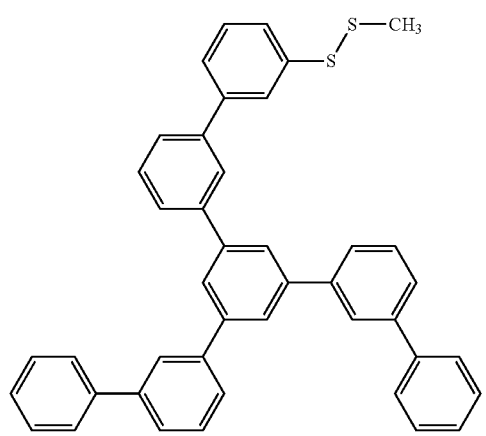
2-2
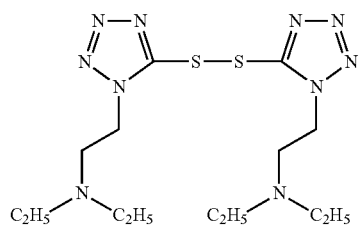
2-3
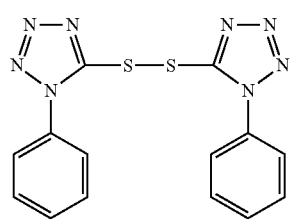
2-4
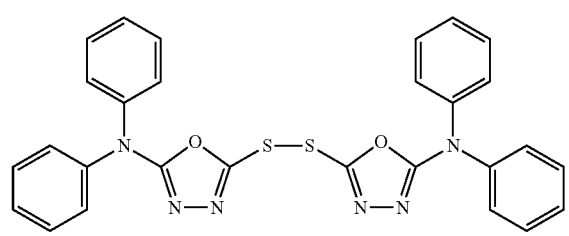
-continued
2-5
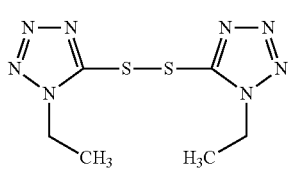
2-6
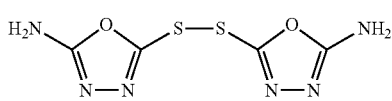
2-7
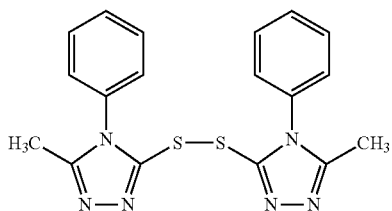
2-8
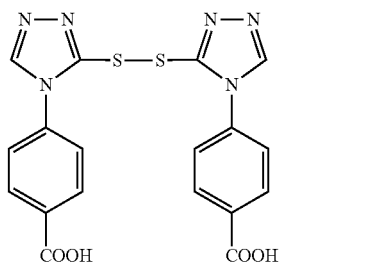
2-9
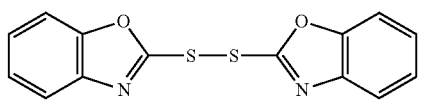
2-10
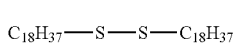
2-11
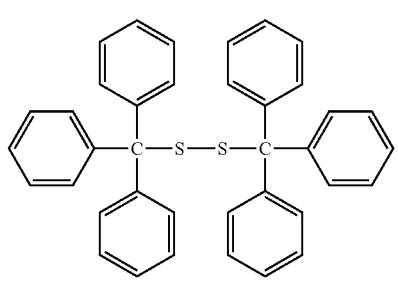
[Chem. 20]
3-1
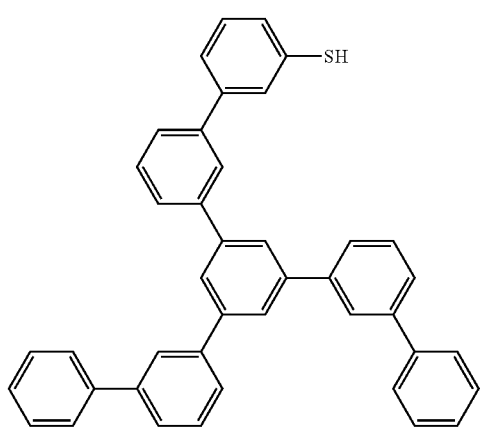

-continued
3-2
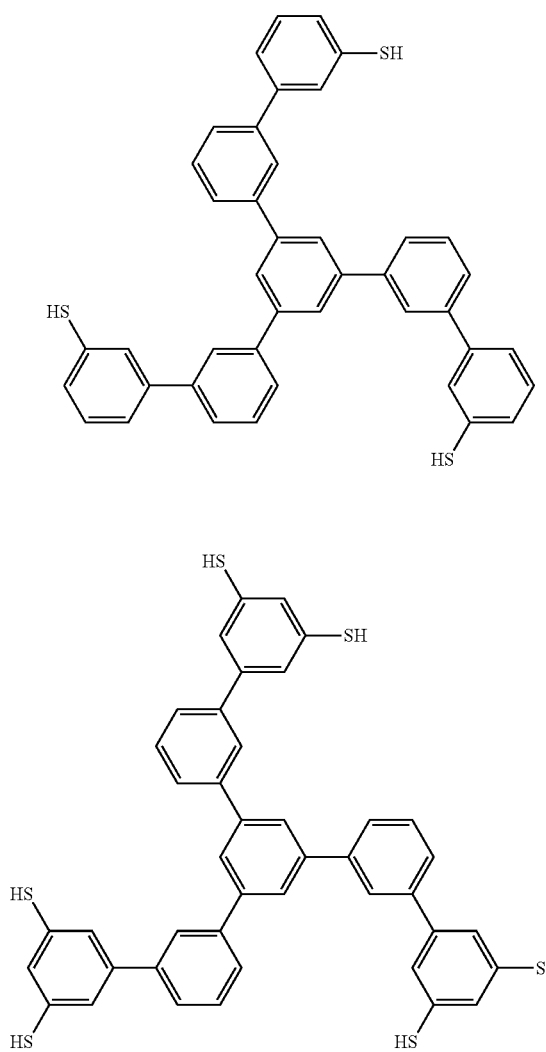
[Chem. 21]
3-4
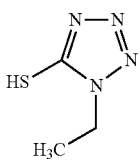
3-5
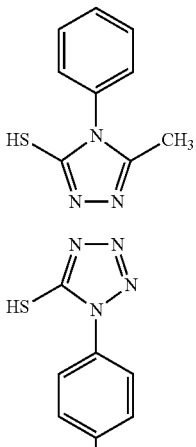
3-6
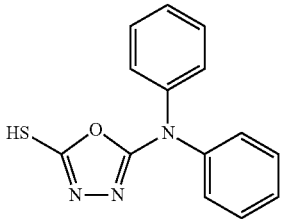
3-7
3-8
3-9
3-10
3-11
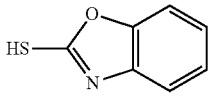
3-12
C₁₈H₃₇—SH
3-13
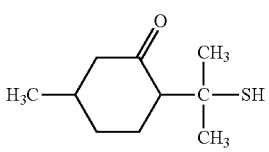
3-14
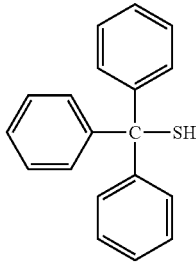

[Chem. 22]

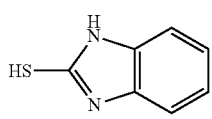

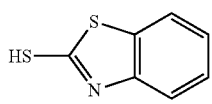

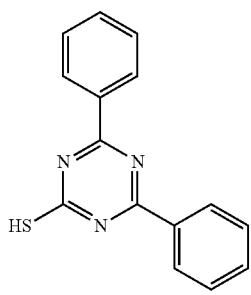

[Chem. 23]

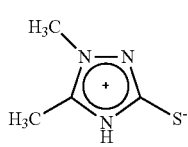
3-15

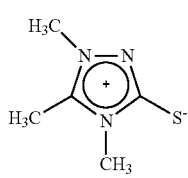
3-16

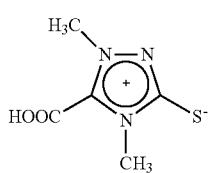
3-17

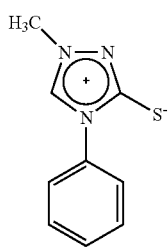
3-18

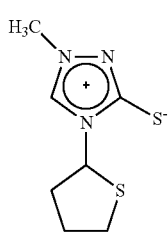
3-19

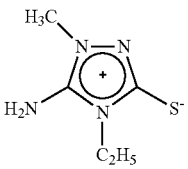
3-15

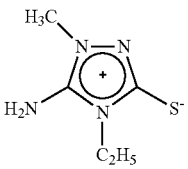
3-23

[Chem. 24]

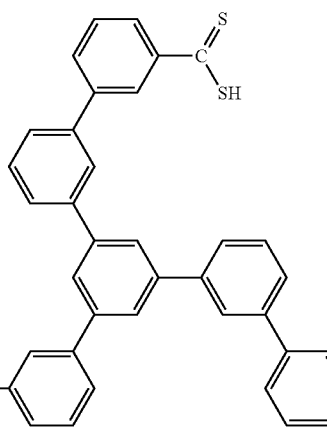
4-1

<Sulfur Atom-Containing Polymer>

The underlying layer of the present invention can contain a sulfur atom-containing polymer. Such a sulfur atom-containing polymer used in the present invention has a weight-average molecular weight preferably in the rage of 1000 to 1000000.

Any sulfur atom-containing polymer can be used in the present invention. Examples of the sulfur atom-containing polymer include polymers composed of the following monomeric unit(s). Numbers following the parentheses each represent a component percentage (molar percentage) of the monomeric unit.

[Chem. 25]

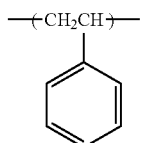
PS1

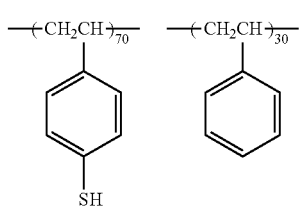
PS2

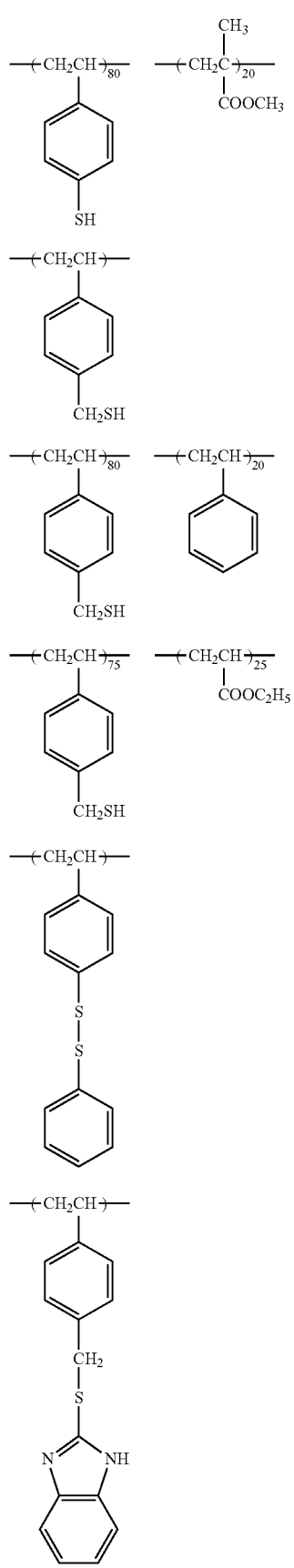
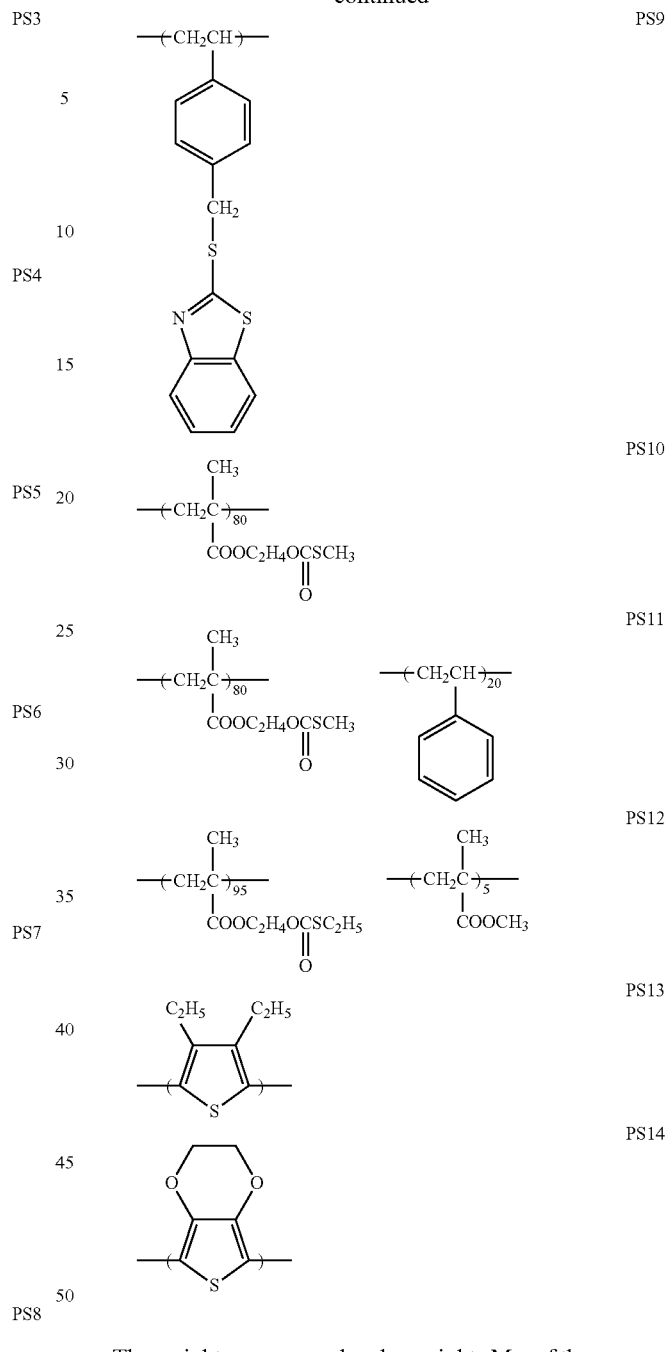
The weight-average molecular weights Mw of the respective sulfur atom-containing polymers described above are shown in Table 2 below.
TABLE 2
| SULFUR ATOM-CONTAINING POLYMER | WEIGHT-AVERAGE MOLECULAR WEIGHT Mw |
|---|---|
| PS 1 | 2000 |
| PS 2 | 4000 |
| PS 3 | 10000 |
| PS 4 | 150000 |
| PS 5 | 50000 |
| PS 6 | 7000 |
| PS 7 | 6000 |

TABLE 2-continued

| SULFUR ATOM-CONTAINING POLYMER | WEIGHT-AVERAGE MOLECULAR WEIGHT Mw |
|---|---|
| PS 8 | 5000 |
| PS 9 | 10000 |
| PS10 | 100000 |
| PS11 | 70000 |
| PS12 | 50000 |
| PS13 | 1000 |
| PS14 | 6000 |

The nitrogen atom-containing polymer used in the present invention can be prepared by any commonly known synthetic method. Preferably, the nitrogen atom-containing polymer used in the present invention has a weight-average molecular weight (Mw) in the range of 1000 to 1000000, like those shown in Table 2.

The underlying layer of the preset invention can be formed by a wet process, for example, application, ink-jetting, coating, or dipping, or by a dry process, for example, deposition (e.g., resistive heating or EB deposition), sputtering, or CVD. The underlying layer preferably has a thickness in the range of 5.0 to 40 nm.

(Composition of Gas Barrier Layer and Production Method)

Preferably, in the organic EL device of the present invention, the resin substrate of the present invention resides on a light emitting side, the gas barrier layer resides between the resin substrate and the transparent anode, and the gas barrier layer is a modified polysilazane layer.

The gas barrier layer of the present invention is formed by a method involving the formation of a polysilazane-containing layer as a precursor layer of the gas barrier layer and a subsequent modification treatment of the precursor layer by, for example, vacuum UV irradiation.

Polysilazane, which is an inorganic ceramic precursor polymer and a component of the polysilazane-containing layer of the present invention, is at least partially modified in the modified polysilazane layer. A heating treatment in a drying process during the formation of the polysilazane-containing layer may modify polysilazane into silica, and/or the modification treatment, e.g., annealing, UV irradiation or vacuum UV irradiation, necessarily modifies polysilazane into silica, for example. In the modification treatment, the entire polysilazane is not necessarily modified, as noted above. For example, the modification of a region around a UV-irradiated surface is acceptable.

<Component of Polysilazane>

"Polysilazane" used in the present invention is an inorganic ceramic precursor polymer having silicon-nitrogen bonds, such as $SiO_xN_y$, which has, for example, Si—N, Si—H, and N—H bonds and is an intermediate solid solution of either or both of $SiO_2$ and $Si_3N_4$.

Preferred polysilazane is readily changed into ceramic and modified into silica at a relatively low temperature. Examples of such a preferred polysilazane include a compound having a main framework of the unit represented by the following general formula (I) described in Japanese Unexamined Patent Application Publication No. H8-112879.

[Chem. 26]

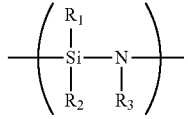

General formula (I)

In general formula (I), $R_1$, $R_2$, and $R_3$ each independently represent, for example, a hydrogen atom, alkyl group, alkenyl group, cycloalkyl group, aryl group, alkylsilyl group, alkylamino group, or alkoxy group.

In the present invention, perhydropolysilazane (PHPS) in which all of $R_1$, $R_2$, and $R_3$ are hydrogen atom is particularly preferred to form a dense polysilazane-containing layer.

Organopolysilazane, in which some of the hydrogen atoms bonded to Si are replaced with, for example, an alkyl group, enhances adhesiveness between the polysilazane-containing layer and the underlying flexible resin substrate, and also provides toughness to the hard brittle ceramic polysilazane layer to prevent cracks even if the ceramic polysilazane layer is thick (i.e., its average thickness is large) because organopolysilazane contains an alkyl group, such as methyl group. Thus, perhydropolysilazane or organopolysilazane, or a mixture thereof can be used as needed in view of the use of the present invention.

Perhydropolysilazane is presumed to have a linear structure and ring structure, typically a 6-membered ring or 8-membered ring, and has a number-average molecular weight (Mn) (polystyrene-equivalent molecular weight) in the range of approximately 600 to 2000. Perhydropolysilazane is in the form of liquid or solid depending on its molecular weight. Perhydropolysilazane is commercially available in the form of a solution containing dissolved perhydropolysilazane. Such a solution can be used as it is as a polysilazane-containing coating solution.

Further examples of polysilazane that changes into a ceramic at a relatively low temperature include: silicon alkoxide adduct of polysilazanes prepared by a reaction of silicon alkoxide with polysilazane having a main framework composed of a unit represented by general formula (I) (see Japanese Unexamined Patent Application Publication No. H5-238827, for example); glycidol adduct of polysilazanes prepared by a reaction with glycidol (see Japanese Unexamined Patent Application Publication No. H6-122852, for example); alcohol adduct of polysilazanes prepared by a reaction with an alcohol (see Japanese Unexamined Patent Application Publication No. H6-240208, for example); metal carboxylic acid salt adduct of polysilazanes prepared by a reaction with a metal carboxylic acid salt (see Japanese Unexamined Patent Application Publication No. H6-299118, for example); acetylacetonate complex adduct of polysilazanes prepared by a reaction with a metal-containing acetylacetonate complex (see Japanese Unexamined Patent Application Publication No. H6-306329, for example); and fine particulate metal-containing polysilazanes prepared by addition of a fine particulate metal (see Japanese Unexamined Patent Application Publication No. H7-196986, for example).

Preferred organic solvents used in the preparation of a polysilazane-containing coating solution for forming the polysilazane-containing layer should not contain alcohols or water, which readily react with polysilazane. Thus, examples of organic solvents usable in the preparation include hydrocarbon solvents, such as aliphatic hydrocarbons, alicyclic hydrocarbons, and aromatic hydrocarbons; halogenated hydrocarbon solvents; and ethers, such as aliphatic ethers and cycloaliphatic ethers. Specific examples include hydrocarbons, such as pentane, hexane, cyclohexane, toluene, xylene, Solvesso, and turpentine; halogenated hydrocarbons, such as methylene chloride and trichloroethane; and ethers, such as dibutyl ether, dioxane, and tetrahydrofuran. These organic solvents may be selected in view of their solubility of polysilazane and/or their evaporation rate. Mixtures of these organic solvents may also be used.

The concentration of polysilazane in the polysilazane-containing coating solution, which depends on the thickness of the target polysilazane-containing layer and the pot life of the coating solution, is preferably in the range of 0.2 to 35 wt %.

The coating solution for forming the polysilazane-containing layer may contain a catalyst, for example, an anime or metal, to facilitate the modification into a silicon oxide compound. Specific examples include AQUAMICA NAX120-20, NN110, NN310, NN320, NL110A, NL120A NL150A, NP110, NP140, and SP140, available from AZ Electronic Materials.

<Formation of Polysilazane-Containing Layer>

The polysilazane-containing layer is formed preferably with the above-described coating solution for forming the polysilazane-containing layer by a wet process. Examples of such a wet process include spin coating, casting, die coating, blade coating, roll coating, ink jetting, printing, spray coating, curtain coating, and the LB method (Langmuir-Blodgett method).

In the present invention, the polysilazane-containing layer may have any thickness in view of the use of the present invention. For example, the dry thickness is preferably in the range of 1 nm to 100 μm, more preferably 10 nm to 10 μm, most preferably 10 nm to 1 μm.

Preferably, the polysilazane-containing layer of the present invention formed with the coating solution for forming the polysilazane-containing layer is dehydrated prior to or during the modification treatment. Thus, a first drying process for removing an organic solvent in the polysilazane-containing layer and a second drying process for removing water (or dehydration) in the polysilazane-containing layer may be employed.

The first drying process can be performed under any conditions, for example, thermal conditions, that can primarily remove an organic solvent, or also remove water. A higher heating temperature is preferred in view of rapidity. It is preferred that the heating temperature and time be determined so as to avoid thermal damage of the thin resin substrate. For example, the heating temperature is preferably 150° C. or less if a poly (ethylene terephthalate) substrate having a glass transition temperature (Tg) of 70° C. is used as the thin resin substrate. The heating time should be controlled to remove an organic solvent and also to reduce thermal damage on the resin substrate. For a heating temperature of 150° C. or less, the heating time can be 30 minutes or less.

The second drying process removes water in the polysilazane-containing layer, preferably in a low humidity environment. Since the humidity in a low humidity environment varies with the temperature of the environment, preferred temperature and humidity depend on the dew point of the environment. The dew point is preferably 4° C. or less (at a temperature of 25° C. and humidity of 25%), more preferably −8° C. or less (at a temperature of 25° C. and humidity of 10%), further preferably −31° C. or less (at a temperature of 25° C. and humidity of 1%). To enhance the removal of water, this drying process may be performed at a low pressure in the range of 0.1 MPa to atmospheric pressure.

Preferred conditions in the second drying process are determined based on those in the first drying process. In the case where the first drying process for removing an organic solvent is performed at a temperature in the range of 60 to 150° C. for 1 to 30 minutes, then the second drying process for removing water is performed at a dew point of 4° C. or less for 5 to 120 minutes.

After the second drying process for removing water, the polysilazane-containing layer of the present invention is preferably kept dried until and during the modification treatment.

<Modification Treatment of Polysilazane-Containing Layer>

In the present invention, the modified polysilazane layer is preferably formed by a modification treatment of the polysilazane-containing layer.

The modification treatment is performed on polysilazane in the polysilazane-containing layer, and the whole or a part of polysilazane in the polysilazane-containing layer is modified.

The modification treatment can be carried out by any known method involving a conversion reaction of polysilazane. However, the modification of the polysilazane-containing layer into a silicon oxide or silicon oxynitride film by substitution reaction of silazane requires a heating treatment at 450° C. or more, and thus is not suitable for the thin resin substrate of the present invention. Modification treatments suitable for the thin resin substrate of the present invention include those that can progress a conversion reaction at a low temperature, such as a plasma treatment, ozone treatment, UV irradiation, and vacuum UV irradiation.

The polysilazane-containing layer is preferably dehydrated prior to the modification treatment, as described above.

Preferred modification treatments usable in the present invention are UV irradiation, vacuum UV irradiation, and plasma irradiation noted above. Vacuum UV irradiation is particularly preferred in view of efficiency of polysilazane modification.

UV irradiation and vacuum UV irradiation will now described as typical modification treatments.

<UV Irradiation>

UV irradiation, which is one of the candidate modification treatments, is described below.

UV rays (or ultraviolet light) generate ozone and reactive oxygen atoms which have high oxidizing ability and can modify the polysilazane-containing layer at a low temperature to yield a highly dense insulating silicon oxide or silicon oxynitride film.

UV irradiation heats the resin substrate, and excites or activates $O_2$ and $H_2O$, which contribute to the modification of polysilazane into ceramic (conversion into silica), as well as polysilazane, thereby facilitating the modification of polysilazane into ceramic and forming a highly dense ceramic film. The UV irradiation may be performed during the preparation of a coating solution for forming the polysilazane-containing layer or after the formation of the polysilazane-containing layer with a coating solution for forming the polysilazane-containing layer.

Any common UV generator can be used in the present invention.

In the present invention, "UV" typically refers to electromagnetic radiation having a maximum radiation wavelength in the range of 10 to 400 nm. Preferably, the UV irradiation uses UV having a maximum radiation wavelength in the range of 210 to 350 nm, which differs from UV used in the vacuum UV irradiation (in the range of 10 to 200 nm).

The irradiation intensity and time are appropriately determined such that the thin resin substrate supporting the polysilazane-containing layer to be irradiated is not damaged.

In the case of using the resin substrate having a thickness in the range of 3 to 50 μm of the present invention, a lamp of an intensity of 2 kW (80 W/cm×25 cm) is used, and the distance between the surface of the flexible resin substrate and the lamp is adjusted such that the intensity at the surface falls in the range of 20 to 300 mW/cm$^2$, preferably 50 to 200 mW/cm$^2$, and the irradiation time can be in the range of 0.1 second to 10 minutes. Typically, a temperature of the flexible resin substrate of 150° C. or more during the UV irradiation deforms the resin substrate and impairs, for example, the strength of the resin substrate. The temperature of the resin substrate during the UV irradiation has no general upper limit, and can be determined depending on the type of the flexible resin substrate by a skilled artisan. The UV irradiation can be performed under any atmosphere, for example, in air.

Any UV light source can be used, and examples include metal halide lamps, high-pressure mercury lamps, low-pressure mercury lamps, xenon arc lamps, carbon arc lamps, UV lasers, and excimer lamps (lamps emitting a single wavelength of 222 nm or 308 nm, for example, a lamp available from USHIO INC.). To achieve uniform and efficient irradiation of the coating layer, UV produced by a light source is preferably reflected at a reflector onto the coating layer.

Either of a batch or continuous process may be employed in the UV irradiation, depending on the shape of the flexible resin substrate. When the flexible resin substrate having the polysilazane-containing layer thereon is a long film, the UV irradiation can be continuously performed on the long film traveling through a drying zone with a UV light source, such as that described above, for the modification into ceramic. The UV irradiation time is determined depending on the composition and/or contents of individual components of the coated resin substrate and the coating solution, typically in the range of 0.1 second to 10 minutes, preferably 0.5 second to 3 minutes.

<Vacuum UV Irradiation; Excimer Irradiation>

The more preferred modification treatment employed in the present invention is vacuum UV irradiation.

Vacuum UV irradiation uses energy of 100 to 200 nm light, preferably 100 to 180 nm light, whose energy is higher than the energy of interatomic bonds in polysilazane. Such a vacuum UV irradiation breaks the interatomic bonds solely by photons, i.e., a photon process, and progresses the oxidation by reactive oxygen and ozone, thereby forming, for example, a silicon oxide film at a relatively low temperature.

Preferred light sources for the vacuum UV irradiation include rare-gas excimer lamps, such as an excimer irradiation device MECL-M-1-200 available from M.D.COM. Inc. (wavelength of irradiation: 172 nm; gas in lamp: Xe).

Rare gas atoms, such as Xe, Kr, Ar, and Ne, do not form a chemical bond to form a molecule. Thus, rare gas is referred to as inert gas. In contrast, energized rare gas atoms (excited atoms) can form bonds with other atoms to form molecules. The case of xenon is described below.

e+Xe e e+Xe*
Xe*+Xe+Xe e Xe$_2$*+Xe

Xe$_2$*, which is an excited excimer molecule, emits 172 nm excimer light when it returns to the ground state.

Excimer lamps have significantly high efficiency because they emit light at one wavelength and barely emit light at other wavelengths.

No emission of light at unintended wavelengths keeps the temperature of an object at a low level. Furthermore, excimer lamps take little time to light and re-light, i.e., can be lighted and blink quickly.

A known method of producing excimer light is dielectric barrier discharge. Dielectric barrier discharge involves the formation of a gas space between two electrodes with a dielectric (transparent quartz in the case of an excimer lamp) provided therebetween, and application of a high-frequency high voltage of several tens of kHz to the two electrodes to cause micro discharge, which is thunder-like fine discharge, within the gas space. A streamer of the micro discharge reaches the tube wall (the dielectric), and charge remains on the surface of the dielectric. The micro-discharge then disappears. During the dielectric barrier discharge, micro discharge spreads on the entire tube wall, and repeatedly appears and disappears, which cause visible flickering. An extremely hot streamer that reaches the tube wall directly and locally may accelerate the deterioration of the tube wall.

Alternative to the dielectric barrier discharge, electrodeless field discharge may be employed to efficiently produce excimer light. This discharge involves capacitive coupling and is also referred to as RF discharge. A lamp, electrodes, and their arrangement may be the same as dielectric barrier discharge. A lamp can be lighted at a high frequency of several MHz applied to electrodes. Since electrodeless field discharge is spatially and temporally uniform discharge, a lamp can be lighted without flickering and have a long lifetime.

In the case of dielectric barrier discharge, micro discharge occurs only between the electrodes. The outer electrode should extend across the whole outer surface to cause the discharge everywhere in the discharging space, and also should be transmissive to emit light outward. Thus, a grid electrode formed of a thin metal wire is used. Such an electrode using a thin wire so as not to block the light is readily damaged by, for example, ozone generated by vacuum UV irradiation under an oxygen atmosphere.

To prevent this damage, a lamp-surrounding space, i.e., the inside of an irradiation device, should be filled with an inert gas, and a synthetic quartz window is required to emit the irradiation light. Synthetic quartz is an expensive disposal and causes light loss.

A bicylindrical lamp has an outer diameter of approximately 25 mm. Thus, the difference in the distances to a bicylindrical lamp from an irradiated area just beneath the lamp and from that facing the side of the lamp is not negligible and results in a large difference in irradiance. Hence, uniform irradiance cannot be achieved even if bicylindrical lamps are arranged close to each other. An irradiation device provided with a synthetic quartz window can achieve uniform irradiance, because the above-described distances can be the same in this case.

In the case of electrodeless field discharge, the outer electrode does not need to be a grid. Glow discharge occurs everywhere in the discharging space merely with an outer electrode locally disposed on the outer surface of a lamp. Typically, the outer electrode is formed of an aluminum block, functions also as a light reflector, and is disposed on the back surface of a lamp. Synthetic quartz is also needed to achieve uniform irradiance in this case, because the outer diameter of a lamp is as large as that of a lamp utilizing dielectric barrier discharge.

A tubular excimer lamp is characterized by a simple structure. This lamp merely consists of a quartz tube with closed ends and filled with a gas for causing excimer light emission. Thus, this is a very inexpensive light source.

A bicylindrical lamp is closed by connecting the ends of an outer and inner tubes, and thus readily broken during its use or transport. A tubular lamp has an outer diameter of approximately 6 to 12 mm, and a thick tubular lamp requires a high starting voltage.

Either of dielectric barrier discharge and electrodeless field discharge may be employed. The electrode may have a flat surface that faces a lamp. A lamp having a curved surface that fits to a curve on a lamp can be firmly fixed and attached to the lamp, thereby stabilizing discharge. When the curved surface is made of aluminum, such a curved surface can function also as a light reflector.

A Xe excimer lamp can efficiently produce light because it emits UV at a single short wavelength of 172 nm. Light from a Xe excimer lamp has a large coefficient of absorption of oxygen, and thus can generate a large amount of radical oxygen species and ozone with a slight amount of oxygen. The energy of light at a short wavelength of 172 nm breaks bonds in an organic compound and is known to show a high performance. Radical oxygen, ozone, and high energy provided by UV irradiation can modify the polysilazane-containing coating layer within a short time. Thus, a Xe excimer lamp can decrease a treatment time and device size by virtue of its high throughput as compared to a low-pressure mercury lamp emitting light with a wavelength of 185 nm or 254 nm and plasma cleaning, and can be used in irradiation of an organic material and plastic substrate which are readily thermally damaged.

An excimer lamp shows highly efficient light production and thus can be lighted at a low electricity. Moreover, an excimer lamp does not produce light at a long wavelength which is a contributing factor of temperature increase by light, and can irradiate an object with light at a single wavelength within the UV range. Thus, an excimer lamp causes a small increase in the temperature at an irradiated surface of an object, and is suitable for a flexible resin substrate which is readily thermally affected.

[Components of Organic Functional Layer Group and Production Method]

Compositions of layers in an organic functional layer group formed on or above the transparent anode of the organic EL device of the present invention, and methods of forming these layers will now be described. A charge-injecting layer, luminous layer, hole-transporting layer, electron-transporting layer, and blocking layer will be described in this order as typical examples of the layers.

(Charge-Injecting Layer)

The charge-injecting layer of the organic EL device of the present invention is disposed between the electrode and luminous layer to decrease the driving voltage and increase the luminance. Charge-injecting layers are described in detail in section 2 of Part II "Denkyoku Zairyo (Electrode Material)" (pp. 123 to 166) of "Yuuki EL Soshi to Sono Kougyouka Saizensen (Organic EL Device and Frontier of Its Industrialization)" (published on Nov. 30, 1998, NTS Inc.), and include a hole-injecting layer and electron-injecting layer.

Typically, the charge-injecting layer may be disposed between the transparent anode and the luminous layer or between the transparent anode and the hole-transporting layer in the case of a hole-injecting layer, and between the cathode and the luminous layer or between the cathode and the electron-transporting layer in the case of an electron-injecting layer.

Hole-injecting layers are described in detail also in, for example, Japanese Unexamined Patent Application Publications Nos. H9-45479, H9-260062, and H8-288069. Examples of the material for the hole-injecting layer include porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylamine derivatives, carbazole derivatives, indolocarbazole derivatives, isoindole derivatives, acene derivatives, such as anthracene and naphthalene, fluorene derivatives, fluorenone derivatives, polyvinylcarbazoles, polymers or oligomers having aromatic amine-containing main chains or side chains, polysilanes, and conductive polymers or oligomers (e.g., PEDOT (poly(ethylene dioxythiophene), PSS (poly styrenesulfonic acid), aniline-based copolymers, polyanilines, and polythiophenes).

Examples of the triarylamine derivatives include benzidine-based compounds, such as α-NPD (4,4'-bis[N-(1-naphthyl)-N-phenylamino]biphenyl); starburst polymers, such as MTDATA (4,4',4"-tris[N-(3-methylphenyl)-N-phenylamino]triphenylamine); and compounds having triarylamine-binding cores containing fluorine or anthracene.

Further examples of the hole-transporting material include hexaazatriphenylene derivatives, such as compounds described in Japanese Unexamined Patent Application Publications Nos. 2003-519432 and 2006-135145.

Electron-injecting layers are described in detail also in Japanese Unexamined Patent Application Publications Nos. H6-325871, H9-17574, and H10-74586. Preferred examples of the material for an electron-injecting layer include metals, such as strontium and aluminum; alkali metal compounds, such as lithium fluoride, sodium fluoride, and potassium fluoride; alkali metal halides, such as magnesium fluoride and calcium fluoride; alkaline earth metal compounds, such as magnesium fluoride; metal oxides, such as aluminum oxide; and metal complexes, such as 8-hydroxyquinoline lithium (Liq). Organic materials, such as metal complexes, are preferred for a transparent cathode in the present invention. The electron-injecting layer preferably is a very thin film, and preferably has a thickness in the range of 1 nm to 10 μm depending on its material.

(Luminous Layer)

In the organic EL device of the present invention, the luminous layer, which is a component of the organic functional layer group, preferably contains a phosphorescent compound as a luminescent material.

The luminous layer emits light by the recombination of electrons injected from the anode or electron-injecting layer with holes injected from the hole-injecting layer. Light emission can occur in the luminous layer and/or the interface(s) between the luminous layer and its adjoining layer(s).

The luminous layer may contain any luminescent material that satisfies requirements for luminescence. Multiple luminous layers having the same emission spectrum or peak emission wavelength may be used. In this case, a non-luminous interlayer is preferably disposed between two luminous layers.

The total thickness of the luminous layer(s) is preferably in the range of 1 to 100 nm, more preferably 1 to 30 nm to achieve low driving voltage. The total thickness of the luminous layers includes the thickness(es) of the non-luminous interlayer(s) between the luminous layers, if any.

In the present invention, two or more luminous layers are deposited. Each luminous layer preferably has a thickness in the range of 1 to 50 nm, preferably 1 to 20 nm. In the case of two or more deposited luminous layers each emitting blue, green, or red light, the thicknesses of these luminous layers can be independently determined.

The luminous layer described above can be formed with a luminescent material and host compound described later by a known method, for example, vacuum deposition, spin coating, casting, the LB method (Langmuir-Blodgett method), or ink jetting.

The luminous layer may be composed of two or more luminescent materials. For example, a single luminous layer may contain a phosphorescent material and fluorescent material (also referred to as a fluorescent dopant or compound). Preferably, the luminous layer contains a host compound (also referred to as a luminescence host) and a luminous material (also referred to as a luminous dopant compound), and the luminous material emits light.

<Host Compound>

The host compound contained in the luminous layer preferably has a phosphorescence quantum yield of less than 0.1, more preferably less than 0.01 at room temperature (25° C.) Preferably, the host compound has a volume percentage of 50% or more to all the compounds contained in the luminous layer.

One or multiple known host compounds may be used. The use of multiple host compounds can control charge transportation and yield a highly effective organic electroluminescent device. Furthermore, the use of multiple luminous materials can provide mixtures of different colors of light, thereby generating any color.

Examples of the host compound contained in the luminous layer include known low-molecular-weight compounds and high-molecular-weight compounds having a repeating unit (s), such as low-molecular-weight compounds containing a polymerizable group, for example, vinyl or epoxy group (i.e., deposition-polymerizable luminous hosts).

Examples of the host compound usable in the present invention include compounds described in Japanese Unexamined Patent Application Publications Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837; US Patent Application Publications Nos. 2003/0175553, 2006/0280965, 2005/0112407, 2009/0017330, 2009/0030202, and 2005/238919; International Patent Publications WO2001/039234, WO2009/021126, WO2008/056746, WO2004/093207, WO2005/089025, WO2007/063796, WO2007/063754, WO2004/107822, WO2005/030900, WO2006/114966, WO2009/086028, WO2009/003898, and WO2012/023947; Japanese Unexamined Patent Application Publications Nos. 2008-074939 and 2007-254297; and European Patent No. 2034538.

<Luminescent Material>

Examples of the luminescent material usable in the present invention include phosphorescence-emitting compounds (also referred to as phosphorescent compounds, phosphorescent materials, or phosphorescent dopants) and fluorescence-emitting compounds (also referred to as fluorescent compounds or fluorescent materials).

<Phosphorescent Compound>

A phosphorescent compound emits light upon the transition from an excited triplet state, and emits phosphorescent light at room temperature (25° C.). A phosphorescent compound has a phosphorescence quantum yield of 0.01 or more, preferably 0.1 or more at 25° C.

The phosphorescence quantum yield can be determined by a method described in page 398 of "Bunkou II (Spectroscopy II)" of the series of "Jikken Kagaku Kouza 7 (Experimental Chemistry 7), 4th Edition" (1992, Maruzen Publishing Co., Ltd.). Any solvent may be used to determine the phosphorescence quantum yield in solution. A phosphorescent compound used in the present invention has a phosphorescence quantum yield of 0.01 or more in solution.

The phosphorescent compound may be appropriately selected from any known compound used in a luminous layer of a traditional organic EL device. Preferred examples include complexes containing metals of Groups 8 to 10. Iridium compounds, osmium compounds, platinum compounds (platinum complexes), and rare earth element complexes are more preferred, and iridium compounds are most preferred.

In the present invention, at least one luminous layer may contain multiple phosphorescent compounds. The luminous layer may have a gradient concentration ratio of one phosphorescent compound to another across the thickness direction.

Examples of the known phosphorescent compound usable in the present invention include compounds described in the following publications.

Nature, 395, 151 (1998); Appl. Phys. Lett. 78, 1622 (2001); Adv. Mater. 19, 739 (2007); Chem. Mater. 17, 3532 (2005); Adv. Mater. 17, 1059 (2005); and International Paten Publications WO2009/100991, WO2008/101842, WO2003/040257, US Patent Application Publications Nos. 2006/835469, 2006/0202194, 2007/0087321, and 2005/0244673.

Further examples include compounds described in the following publications: Inorg. Chem. 40, 1704 (2001); Chem. Mater. 16, 2480 (2004); Adv. Mater. 16, 2003 (2004); Angew. Chem. Int. Ed. 2006, 45, 7800; Appl. Phys. Lett. 86, 153505 (2005); Chem. Lett. 34, 592 (2005); Chem. Commun. 2906 (2005); Inorg. Chem. 42, 1248 (2003); International Patent Publications WO2009/050290, WO2002/015645, and 2009/000673; US Patent Application Publication No. 2002/0034656; U.S. Pat. No. 7,332,232; US Patent Application Publications Nos. 2009/0108737 and 2009/0039776; U.S. Pat. Nos. 6,921,915 and 6,687,266; US Patent Application Publications Nos. 2007/0190359, 2006/0008670, 2009/0165846, and 2008/0015355; U.S. Pat. Nos. 7,250,226 and 7,396,598; US Patent Application Publications Nos. 2006/0263635, 2003/0138657, and 2003/0152802; and U.S. Pat. No. 7,090,928.

Still further Examples include compounds described in the following publications: Angew. Chem. Int. Ed. 47, 1 (2008); Chem. Mater. 18, 5119 (2006); Inorg. Chem. 46, 4308 (2007); Organometallics 23, 3745 (2004); Appl. Phys. Lett. 74, 1361 (1999); International Patent Publications WO2002/002714, WO2006/009024, WO2006/056418, WO2005/019373, WO2005/123873, WO2005/123873, WO2007/004380, and WO2006/082742; US Patent Application Publications Nos. 2006/0251923 and 2005/0260441; U.S. Pat. Nos. 7,393,599, 7,534,505, and 7,445,855; US Patent Application Publications Nos. 2007/0190359 and 2008/0297033; U.S. Pat. No. 7,338,722; US Patent Application Publication No. 2002/0134984; U.S. Pat. No. 7,279,704; and US Patent Application Publications Nos. 2006/098120 and 2006/103874.

Still further examples include compounds described in the following publications: International Patent Publications WO2005/076380, WO2010/032663, WO2008/140115, WO2007/052431, WO2011/134013, WO2011/157339, WO2010/086089, WO2009/113646, WO2012/020327, WO2011/051404, WO2011/004639, and WO2011/073149; and Japanese Unexamined Patent Application Publications Nos. 2012-069737, 2009-114086, 2003-81988 2002-302671, and 2002-363552.

Preferred examples of the phosphorescent compound usable in the present invention include organic metal complexes containing Ir as the central metal; and complexes having a coordination involving at least one of metal-carbon bonds, metal-nitrogen bonds, metal-oxygen bonds, and metal-sulfur bonds.

The above-described phosphorescent compounds (also referred to as phosphorescent metal complexes) can be synthesized by methods described in the following publications: Organic Letter, vol. 3, No. 16, pp. 2579 to 2581 (2001); Inorganic Chemistry, Vol. 30, No. 8, pp. 1685 to 1687 (1991); J. Am. Chem. Soc., Vol. 123, p. 4304 (2001); Inorganic Chemistry, Vol. 40, No. 7, pp. 1704 to 1711 (2001); Inorganic Chemistry, Vol. 41, No. 12, pp. 3055 to 3066 (2002); New Journal of Chemistry, Vol. 26, p. 1171 (2002); European Journal of Organic Chemistry, Vol. 4, pp. 695 to 709 (2004); and reference literatures described in these publications.

<Fluorescent Compound>

Examples of the fluorescent compound include coumarin dyes, pyran dyes, cyanine dyes, croconium dyes, squarylium dyes, oxobenzanthracene dyes, fluorescein dyes, rhodamine dyes, pyrylium dyes, perylene dyes, stilbene dyes, polythiophene dyes, and rare earth element complex-based fluorescent compounds.

(Hole-Transporting Layer)

The hole-transporting layer is composed of a hole-transporting material, which transports holes. A hole-injecting layer and an electron-blocking layer also function as a hole-transporting layer in a broad sense. One or multiple hole-transporting layers may be used.

A hole-transporting material may be an organic or inorganic compound having a hole-injecting, hole-transporting or electron-blocking effect. Examples include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers, conductive high-molecular-weight oligomers, and thiophene oligomers.

In addition to these compounds, further examples include porphyrin compounds, aromatic tertiary amine compounds, and styrylamine compounds. Aromatic tertiary amine compounds are particularly preferred.

Typical examples of the aromatic tertiary amine compound and styrylamine compound include N,N,N',Nmpound and styrylamdiaminophenyl, N,N'-diphenylN,N'-dbis(3-methylphenyl)-[1,1'-biphenyl]-4,44,4yrylaminere particularly prp-tolylaminophenyl) propane, 1,1-bis(4-di-p-tolylaminophenyl)cyclohexane,N,N,N',N'-tetra-p-tolyl-4,4opdiaminobiphenyl, 1,1-bis(4-di-p-tolylaminophenyl)-4-phenylcyclohexane, bis(4-dimethylamino-2-methylphenyl) phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino) quadriphenyl, N,N,N-tri(p-tolyl)amine, 4-(di-p-tolylamino)-4ylamino(dp-tolylamino)styryl]stilbene, 4-N,N-diphenylamino-(2-diphenylvinyl)benzene, 3-methoxy-4'-N,N-diphenylaminostilbenzene, and N-phenylcarbazole.

The hole-transporting layer can be formed with the material described above by a known method of forming a thin layer, for example, vacuum deposition, spin coating, casting, printing, e.g., ink jetting, or the LB method (Langmuir-Blodgett method). The hole-transporting layer may have any thickness, typically in the range of approximately 5 nm to 5 µm, preferably 5 to 200 nm. The hole-transporting layer may be a monolayer composed of one or more of these materials.

The hole-transporting layer may be doped with an impurity to increase its p-characteristics. Examples of the dopant include those described in Japanese Unexamined Patent Application Publications Nos. H4-297076, 2000-196140, and 2001-102175, and J. Appl. Phys., 95, 5773 (2004).

The hole-transporting layer having high p-characteristics is preferred to produce a power-saving element.

(Electron-Transporting Layer)

The electron-transporting layer is composed of an electron-transporting material, and includes an electron-injecting layer and hole-blocking layer in abroad sense. The electron-transporting layer may be a monolayer or a laminate of multiple layers.

Any material that transports electrons from a cathode to the luminous layer may be used as an electron-transporting material (also as a hole-blocking material) for the layer adjoining the luminous layer, i.e., the electron-transporting layer having a monolayer or laminate structure. Such a material may be any known material, and examples include nitro-substituted fluorene derivatives, diphenylquinone derivatives, thiopyran dioxide derivatives, carbodiimides, fluorenylidene methane derivatives, anthraquinodimethanes, anthrone derivatives, oxadiazole derivatives, thiadiazole derivatives where oxygen atom on the oxadiazole ring of an oxadiazole derivative is replaced with sulfur atom, quinoxaline derivative having quinoxaline ring known as an electron-withdrawing group, polymers having a polymer chain composed of the material described above, and polymers having a main chain composed of the material described above.

Further examples of electron-transporting material include metal complexes of 8-quinolinol derivative, such as tris(8-quinolinol)aluminum ($Alq_3$), tris (5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol) zinc (Znq), and metal complexes where the central atom of these complexes is replaced with In, Mg, Cu, Ca, Sn, Ga or Pb.

The electron-transporting layer can be formed with the material described above by a known method of forming a thin layer, for example, vacuum deposition, spin coating, casting, printing, e.g., ink jetting, or the LB method. The electron-transporting layer may have any thickness, typically in the range of approximately 5 nm to 5 µm, preferably 5 to 200 nm. The hole-transporting layer may be a monolayer composed of one or more of these materials.

(Blocking Layer)

The blocking layer may be a hole-blocking layer or electron-blocking layer, and is used as needed in addition to the above-described layers of the organic functional layer group. Examples of the blocking layer include hole-blocking layers described in Japanese Unexamined Patent Application Publications Nos. H11-204258 and H11-204359, and in page 237 of "Yuuki EL Soshi to Sono Kougyouka Saizensen (Organic EL Device and Frontier of Its Industrialization)" (published on Nov. 30, 1998, NTS Inc.).

The hole-blocking layer functions as an electron-transporting layer in a broad sense. The hole-blocking layer is composed of material that transports electrons but barely transports holes. The hole-blocking layer transports electrons and blocks holes, thereby increasing the probability of the recombination of electrons with holes. The hole-blocking layer may have the same composition as the electron-transporting layer. The hole-blocking layer preferably adjoins the luminous layer.

In contrast, the electron-blocking layer functions as a hole-transporting layer in a broad sense. The electron-blocking layer is composed of material that transports holes but barely transports electrons. The electron-blocking layer transports holes and blocks electrons, thereby increasing the probability of the recombination of electrons with holes. The electron-blocking layer may have the same composition as the hole-transporting layer. The hole-blocking layer used in the present invention has a thickness preferably in the range of 3 to 100 nm, more preferably 5 to 30 nm.

[Cathode]

The cathode is used as an electrode film to supply holes to the organic functional layer group. The cathode is composed of a metal, alloy, organic or inorganic conductive compound or a mixture thereof. Examples include gold, aluminum, silver, magnesium, lithium, magnesium/copper mixtures, magnesium/silver mixtures, magnesium/aluminum mixtures, magnesium/indium mixtures, indium, lithium/aluminum mixtures, rare earth element metals, and oxide semiconductors, for example, ITO, ZnO, $TiO_2$ and $SnO_2$ semiconductors.

The cathode can be formed with the conductive material described above by a method of forming a thin layer, for example, deposition or sputtering. Preferably, the cathode has a sheet resistance of several hundreds $\Omega/\square$ or less, and has a thickness in the range of 5 nm to 5 µm, preferably 5 to 200 nm.

If the organic EL device is of a double-sided emission type that emits light also from the cathode, a highly transmissive cathode is used.

[Sealing Member]

The organic EL device of the present invention preferably includes a sealing member to shield the transparent conductive film (TF) including the transparent anode, the cathode, and the organic functional layer group disposed between the cathode and the transparent anode, from air.

The sealing member used in the present invention can be formed by, for example, forming a sealing resin layer with an adhesive and bonding a sealing material to the layer of the organic EL device.

The sealing member may be disposed as desired to cover a display region of the organic EL device. The sealing member may be either a concave or flat plate, and may have any transparency and insulating ability.

Examples of the material for sealing include glass plates, polymer plates and films, and metal plates and films. Typical examples of the glass plate include soda-lime glasses, barium-strontium-containing glasses, lead glasses, aluminosilicate glasses, barium borosilicate glasses, and quartz glasses. Examples of the polymer plate include plates of polycarbonates, acrylic compounds, poly(ethyleneterephthalate), polyether sulfides, and polysulfones. Examples of the metal plate include plates of one or more metals selected from the group consisting of stainless steel, iron, copper, aluminum, magnesium, nickel, zinc, chromium, titanium, molybdenum, silicon, germanium, and tantalum, and an alloy thereof.

Polymer films and metal films are preferred in the present invention to produce a thin organic EL device. Polymer films preferably have an oxygen permeation rate of $1\times10^{-3}$ ml/($m^2\cdot24$ h·atom) or less as determined in accordance with JIS K 7126-1987 and have a water vapor permeation rate ($25\pm0.5°$ C., relative humidity of $90\pm2\%$) of $1\times10^{-3}$ g/($m^2\cdot24$ h) or less as determined in accordance with JIS K 7129-1992.

The sealing member may be formed into a concave plate by, for example, sandblasting or chemical etching.

Examples of the adhesive used in forming the sealing resin layer include photocurable or thermosetting adhesives containing reactive vinyl groups of acrylic acid oligomers and methacrylic acid oligomers, moisture-curable adhesives, such as 2-cyanoacrylate esters, thermosetting and chemically-curable adhesives (two-component adhesives), such as epoxy adhesives, hot-melt polyamides, polyesters, polyolefins, and cationic UV-curable epoxy resin adhesives.

Given that the organic EL device may be degraded through a thermal treatment, a preferred adhesive is bonded and cured at a temperature in the range of room temperature to 80° C. The adhesive may contain a desiccant dispersed therein.

An adhesive may be applied to the sealing member with a commercially available dispenser or by screen printing.

EXAMPLES

The present invention will now be described in detail by way of Examples, but should not be limited thereto. The term "%" in the following description indicate "wt %", unless described otherwise.

<<Production of Organic EL Device>>

[Production of Organic EL Device 1]

Organic EL device 1 was produced by a method described below. The numbers in the parentheses correspond to those of the components in FIGS. 1A and 1B.

[Formation of Transparent Conductive Film 1]

(Step 1: Preparation of Resin Substrate)

A resin substrate (1) was a 25-µm thick poly(ethylene terephthalate) film (Teijin Tetoron Film G2P2, Teijin DuPont Films Japan Limited, hereinafter abbreviated as PET). The both surfaces of this film had been modified to have adhesiveness.

On the surface of this PET film, a corona treatment was performed with a corona discharge device AGI-080 (KASUGA Electric Works LTD.). The corona treatment was performed in such a manner that the distance between the discharge electrode of the corona discharge device and the surface of the film was 1 mm, at an output of 600 mW/cm² for 10 seconds.

(Step 2: Formation of Gas Barrier Layer)

A gas barrier layer (2) was formed on the resin substrate (1) by plasma CVD described below.

<2.1: Plasma CVD>

On the resin substrate (1), a 250 nm-thick gas barrier layer (2) composed of $SiO_2$ was formed with a plasma CVD device described in Japanese Unexamined Patent Application Publication No. 2007-307784 under the following deposition conditions.

<Deposition Conditions>

Supply rate of material gas (hexamethyldisiloxane: HMDSO): 50 sccm (standard cubic centimeter per minute);

Supply rate of oxygen gas (O$_2$): 500 sccm;
Degree of vacuum in vacuum chamber: 3 Pa;
Electricity applied from Power Source for plasma generation: 0.5 kW;
Frequency of Power Source for plasma generation: 13.56 MHz;
Traveling rate of the flexible resin substrate: 0.5 m/min.

(Step 3: Formation of Transparent Anode)

A transparent anode (4) composed of a thin silver layer was formed on the gas barrier layer (2).

The resin substrate (1) provided with the gas barrier layer (2) thereon was fixed on a substrate holder in a commercially-available vacuum deposition system, and silver (Ag) was placed in a resistive heating tungsten crucible. The crucible was then attached on a first vacuum chamber of the vacuum deposition system.

The first vacuum chamber was evacuated to a vacuum of 4×10$^{-4}$ Pa, and the resistive heating crucible containing silver was electrified and heated. A 15 nm-thick transparent anode (4) composed of silver was then formed at a deposition rate in the range of 0.1 to 0.2 nm/sec. Transparent conductive film (TF) 1 was thereby produced.

[Production of Organic EL Device]

(Step 4: Formation of Organic Functional Layer Group (5) and Cathode (6))

Subsequently, the commercially-available vacuum deposition device was evacuated to a vacuum of 1×10$^{-4}$ Pa, and then a 20 nm-thick hole-transporting layer (HTL) was formed with compound HT-1 described below at a deposition rate of 0.1 nm/sec on transparent conductive film (TF) 1 provided with the transparent anode (4) and being traveling.

Subsequently, a luminous layer having a total thickness of 70 nm was formed by the co-deposition of compound A-3 (blue luminescent dopant), compound A-1 (green luminescent dopant), compound A-2 (red luminescent dopant), and compound H-1 (host compound) in such a manner that compound A-3 was deposited to give a concentration linearly decreasing from 35 to 5 wt % across the thickness by varying the deposition rate across the thickness, compounds A-1 and A-2 were deposited at a constant deposition rate of 0.0002 nm/sec to give a concentration of 0.2 wt %, and compound H-1 was deposited give a concentration linearly increasing from 64.6 to 94.6 wt % across the thickness by varying the deposition rate across the thickness.

A 30 nm-thick electron-transporting layer was then formed with compound ET-1 below, and a 2 nm-thick potassium fluoride (KF) layer was formed on the electron-transporting layer to form an organic functional layer group (5). Subsequently, aluminum was deposited thereon to form a 110 nm-thick cathode (6).

Compounds HT-1, A-1 to 3, H-1, and ET-1 are described below.

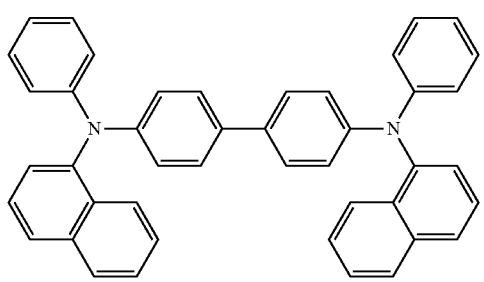

HT-1

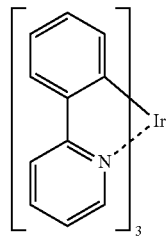

A-1

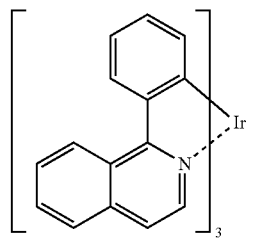

A-2

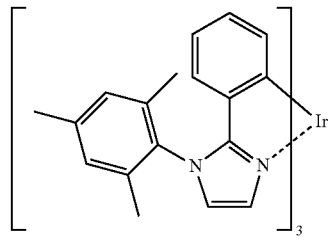

A-3

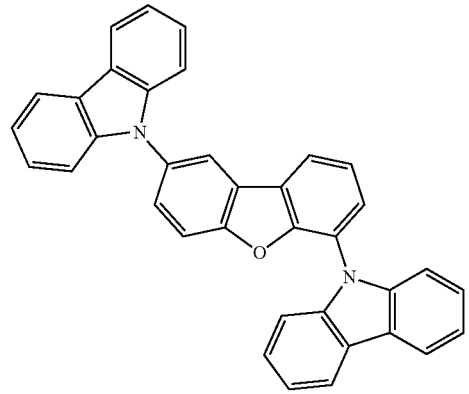

H-1

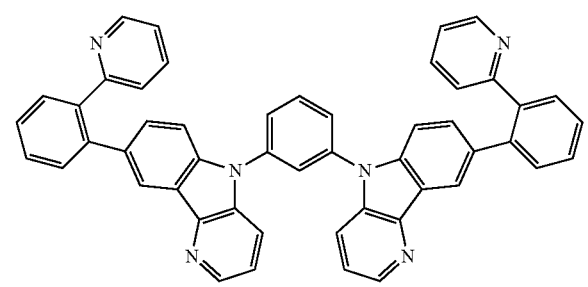

ET-1

(Step 5: Sealing)

The resin substrate, which was a 25 μm-thick PET film provided with the gas barrier layer (2) and was the same as that used in the production of transparent conductive film (TF) 1, was used as a sealing substrate (8). A thermal curing liquid adhesive (epoxy resin) was applied to form a 25 μm-thick sealing resin layer (7) on one side of the sealing substrate (8). A sealing member (S) was thereby formed. The sealing member (S) was then deposited on the cathode (6) of the device. To dispose the ends of extraction electrodes of the transparent anode (4) and the cathode (6) outside of the device, the surface of the sealing resin layer (7) of the sealing member (S) and the surface of the organic functional layer group (5) of the organic EL device were continuously aligned.

The resulting laminate was placed in an evacuation device, and pressure was applied to the laminate from the resin substrate (1) to the cathode (6) and the sealing member (S) at 90° C. and 0.1 MPa for 5 minutes. The laminate was then placed in an atmospheric pressure environment, and heated at 90° C. for 30 minutes to cure the adhesive.

This sealing step was performed in a nitrogen atmosphere at a moisture content of 1 ppm or less, a cleanness class of 100 determined in accordance with JIS B 9920, a dew point of −80° C. or less, and atmospheric pressure with an oxygen concentration of 0.8 ppm or less. Note that description of the formation of extraction lines from the transparent anode (4) and the cathode (6) is omitted.

Organic EL device 1 emitting white light was thereby produced.

The neutral region of organic EL device 1 was determined as follows. The neutral plane was determined by methods described in Japanese Unexamined Patent Application Publications Nos. 2005-251671 and 2006-58764, and the total thickness D of the organic EL device was determined. A region extending upwardly and downwardly from the neutral plane in the range of 10% of D was then determined as the neutral region. The transparent anode (4) was confirmed to reside 17% away from the neutral plane and out of the neutral region.

[Production of Organic EL Device 2]

Organic EL device 2 was produced as in organic EL device 1 except that transparent conductive film 1 with the transparent anode prepared in Step 3 was replaced with transparent conductive film 2 with a transparent anode and an underlying layer prepared in Step 3A described below.

[Production of Transparent Conductive Film 2]

On or above the gas barrier layer (2) provided on the resin substrate (1), which was the same as that used in the production of transparent conductive film 1, an underlying layer and transparent anode (4) composed of a thin silver film were formed by a method below to produce transparent conductive film 2.

The resin substrate (1) having the gas barrier layer (2) thereon was fixed on a substrate holder in a commercially-available vacuum deposition device, and exemplary compound No. 46, which is a nitrogen atom-containing organic compound having a unshared electron pair being not involved in aromaticity and serving as the nitrogen or sulfur atom-containing organic compound, was placed in a resistive heating tungsten crucible. The crucible was then attached on a first vacuum chamber of the vacuum deposition device. Silver (Ag) was placed in a resistive heating tungsten crucible, and the crucible was attached on a second vacuum chamber of the vacuum deposition device.

The first vacuum chamber was evacuated to a vacuum of $4 \times 10^{-4}$ Pa, and the resistive heating crucible containing exemplary compound No. 46 was electrified and heated. A 10 nm-thick underlying layer (3) was then formed at a deposition rate in the range of 0.1 to 0.2 nm/sec.

The resulting resin substrate (1) provided with the underlying layer (3) was then transferred into the second vacuum chamber under a vacuum condition. The second vacuum chamber was evacuated to a vacuum of $4 \times 10^{-4}$ Pa, and the resistive heating crucible containing silver was electrified and heated. A 15 nm-thick transparent anode composed of silver was then formed at a deposition rate in the range of 0.1 to 0.2 nm/sec. Transparent conductive film 2 was thereby produced.

[Position of Transparent Anode in Organic EL Device 2]

The neutral region of organic EL device 2 was determined as described above. The middle of the transparent anode (4) was confirmed to reside 17% away from the neutral plane and out of the neutral region.

[Production of Organic EL Device 3]

Organic EL device 3 was produced as in organic EL device 2 except that transparent conductive film 2 with the gas barrier layer (2) prepared in Step 2 was replaced with transparent conductive film 3 prepared in a step described below.

[Production of Transparent Conductive Film 3]

(Preparation of Coating Solution for Forming Polysilazane-Containing Layer)

Perhydropolysilazane (AQUAMICA NN120-10, non-catalyst type, available from AZ Electronic Materials and abbreviated as PHPS) was used as a coating solution for forming a polysilazane-containing layer.

(Formation of Polysilazane-Containing Layer)

This coating solution for forming a polysilazane-containing layer was applied with a wet bar coater on the surface of the 25 μm-thick PET film 1, i.e., the resin substrate (1), to give a dry thickness of 0.25 μm, followed by drying at 80° C. for 1 minute. A polysilazane-containing layer was thereby formed.

(Formation of Gas Barrier Layer by Modification Treatment of Polysilazane-Containing Layer)

The polysilazane-containing layer was then subjected to a modification treatment involving vacuum UV irradiation with an excimer device described below to form a gas barrier layer (2).

<Excimer Irradiation Device>

Device: Excimer irradiation device MECL-M-1-200, M.D.COM. Inc.;

Irradiation wavelength: 172 nm;

Gas in lamp: Xe.

<Modification Treatment Conditions>

The modification treatment was performed on the resin substrate (1) having the polysilazane-containing layer thereon and being fixed on a movable stage under the following conditions.

Intensity of excimer lamp: 130 mW/cm$^2$ (172 nm)

Distance between the object and light source: 1 mm;

Stage-heating temperature: 70° C.;

Oxygen concentration in the irradiation device: 0.01%;

Irradiation time by the excimer lamp: 5 seconds.

[Position of Transparent Anode in Organic EL Device 3]

The positions of the neutral region and the transparent anode in organic EL device 3 were determined as described above. The middle of the transparent anode (4) was 17% away from the neutral plane and out of the neutral region.

[Production of Organic EL Device 4]

Organic EL device 4 was produced as in organic EL device 3 except that a sealing resin layer (7) of a sealing member (S) has a thickness of 10 μm.

The neutral region of organic EL device 4 was determined as described above, and the transparent anode (4) was confirmed to entirely reside at 8% of the total thickness away from the neutral plane and within the neutral region.

[Production of Organic EL Devices 5 to 9]

Organic EL devices 5 to 9 were produced as in organic EL device 4 except that resin substrates (1) had thicknesses of 5, 10, 45, 60, and 100 μm, respectively.

[Production of Organic EL Devices 10 and 11]

Organic EL devices 10 and 11 were produced as in organic EL device 4 except that, in place of the PET film, a 25 μm-thick poly(ethylene naphthalate) (PEN) film and a 25 μm-thick polycarbonate (PC) film were used, respectively, as the resin substrate (1).

[Production of Organic EL Device 12]

Organic EL device 12 was produced as in organic EL device 5 (the thickness of the resin substrate was 5 μm) except that a resin substrate provided with a supporting film described below was used.

(Formation of Resin Substrate)

On the bottom surface (opposite to the surface on which the organic EL device was to be formed) of the resin substrate (5 μm-thick PET film), which was the same as that used in the production of organic EL device 5, a 20 μm-thick adhesion layer composed of a thermal resistance acrylic resin, and then a 75 μm-thick PET film was applied thereon as a supporting film, followed by compression with a nip roll. A transparent substrate provided with a supporting film was thereby formed.

The adhesion layer and the supporting film were formed in the production of the organic EL device, and removed after the production of the organic EL device was completed.

[Production of Organic EL Device 13]

Organic EL device 13 was produced as in organic EL device 6 (the thickness of the resin substrate was 10 μm) except that a resin substrate provided with a supporting film described below was used.

(Formation of Resin Substrate)

On the bottom side (opposite to the side on which the organic EL device was to be formed) of the resin substrate (25 μm-thick PET film), which was the same as that used in the production of organic EL device 4, a 20 μm-thick adhesion layer composed of a thermal resistance acrylic resin, and then a 75 μm-thick PET film was applied thereon as a supporting film, followed by compression with a nip roll. A transparent substrate provided with a supporting film was thereby formed.

The adhesion layer and the supporting film were formed in the production of the organic EL device, and removed after the production of the organic EL device was completed.

[Production of Organic EL Devices 14 to 17]

Organic EL devices 14 to 17 were produced as in organic EL device 4 except that exemplary compounds No. 47, PN41, 3-15, and PS1 were used, respectively, in place of exemplary compound No. 46, which is the nitrogen or sulfur atom-containing organic compound used in forming the underlying layer (3).

[Production of Organic EL Device 18]

Organic EL device 18 was produced as in organic EL device 4 except that a transparent anode (4) was formed by sputtering described below instead of deposition.

(Formation of Transparent Anode by Sputtering)

The laminate having the underlying layer (3) was subjected to facing target sputtering at an Ar supply rate of 20 sccm, a sputtering pressure of 0.5 Pa, room temperature, an electricity at target side of 150 W, and a layer growth rate of 1.4 nm/s with a facing target sputtering device available from FTS Corporation to form a 25 nm-thick silver layer. The distance between the target and the substrate was 90 mm.

[Production of Organic EL Devices 19 to 21]

Organic EL devices 19 to 21 were produced as in organic EL device 4 except that the thicknesses of transparent anodes (4) were 10, 20, and 30 nm, respectively, by employing different conditions of deposition (temperatures for heating resistive heating crucibles, deposition rates, and deposition times) for forming the transparent anodes (4).

[Production of Organic EL Device 22]

Organic EL device 22 was produced as in organic EL device 1 except that a transparent anode (4) was formed by a method described below.

(Formation of Transparent Anode (ITO) by Sputtering)

The laminate having the gas barrier layer (2), which was the same as that used in organic EL device 1, was subjected to facing target sputtering at an Ar supply rate of 20 sccm, a sputtering pressure of 0.5 Pa, room temperature, an electricity at target side of 150 W, and a layer growth rate of 1.4 nm/s with a facing target sputtering device available from FTS Corporation to form a 15 nm-thick ITO film as the transparent anode (4). The distance between the target and the substrate was 90 mm.

[Production of Organic EL Device 23]

Organic EL device 23 was produced as in organic EL device 1 except that a transparent anode (4) was formed by a method described in Example of Japanese Unexamined Patent Application Publication No. 2009-302029.

(Preparation of Coating Solution (Solution A) for Forming Transparent Anode)

To a solvent mixture composed of 24 g of methyl isobutyl ketone and 36 g of cyclohexanone, 36 g of a fine particulate ITO having an average particle size of 30 nm (trade name: SUFP-HX; SUMITOMO Metal Mining Co., Ltd.) was added, and the solvent mixture was stirred to disperse the particulate therein. To the resulting mixture, 3.8 g of a UV curing urethane acrylate resin binder and 0.2 g of a photoinitiator (trade name: DAROCUR 1173; BASF Japan Ltd.) were added, and the resulting mixture was stirred to prepare a coating solution (Solution A) for forming the transparent conductive electrode containing a fine particulate ITO having an average secondary size of dispersed particle of 125 nm dispersed therein.

(Formation of Transparent Anode (ITO) by Wet Coating)

On the gas barrier layer (2) provided on the resin substrate (1), which was the same as that used in the production of organic EL device 1, the coating solution for forming the transparent anode (Solution A) was applied by wire-bar coating (wire diameter: 0.10 mm), followed by drying at 60° C. for 1 minute. Subsequently, a rolling process was performed with a hard chromium-plated metal roll having a diameter of 100 mm (linear pressure: 196 N/mm, nip width: 0.9 mm), and the binder was cured with a high-pressure mercury lamp (in nitrogen gas at 100 mW/cm$^2$ for 2 seconds). A 300 nm-thick transparent anode composed of the densely-contained fine particulate ITO and a binder matrix was thereby formed.

Transparent conductive films (TF) 1 to 23 used in the production of organic EL devices 1 to 23 are described in Table 3 in detail.

TABLE 3

| | | TRANSPARENT CONDUCTIVE FILM (TF) | | | | | | | | | | | |
|---|---|---|---|---|---|---|---|---|---|---|---|---|---|
| | | RESIN SUBSTRATE (1) | | SUP- PORTING FILM*4 | | GAS BARRIER LAYER (2) | | UNDER- LYING LAYER (3) | TRANSPARENT ANODE (4) | | | ORGANIC EL ELEMENT | |
| *1 | NO. | *2 | *3 | *2 | *3 | *2 | *5 | *6 | *2 | *5 | *7 | *8 | *9 | NOTE |
| 1 | 1 | PET | 25 | — | — | HMDSO | PLASMA CVD | — | SILVER | DEPOSITION | 15 | 25 | OUT OF PORTION | PRESENT INVENTION |
| 2 | 2 | PET | 25 | — | — | HMDSO | PLASMA CVD | No. 46 | SILVER | DEPOSITION | 15 | 25 | OUT OF PORTION | PRESENT INVENTION |
| 3 | 3 | PET | 25 | — | — | PHPS | VACUUM UV | No. 46 | SILVER | DEPOSITION | 15 | 25 | OUT OF PORTION | PRESENT INVENTION |
| 4 | 3 | PET | 25 | — | — | PHPS | VACUUM UV | No. 46 | SILVER | DEPOSITION | 15 | 10 | WITHIN PORTION | PRESENT INVENTION |
| 5 | 4 | PET | 5 | — | — | PHPS | VACUUM UV | No. 46 | SILVER | DEPOSITION | 15 | 10 | OUT OF PORTION | PRESENT INVENTION |
| 6 | 5 | PET | 10 | — | — | PHPS | VACUUM UV | No. 46 | SILVER | DEPOSITION | 15 | 10 | OUT OF PORTION | PRESENT INVENTION |
| 7 | 6 | PET | 45 | — | — | PHPS | VACUUM UV | No. 46 | SILVER | DEPOSITION | 15 | 10 | OUT OF PORTION | PRESENT INVENTION |
| 8 | 7 | PET | 60 | — | — | PHPS | VACUUM UV | No. 46 | SILVER | DEPOSITION | 15 | 10 | OUT OF PORTION | COMPARATIVE EXAMPLE |
| 9 | 8 | PET | 100 | — | — | PHPS | VACUUM UV | No. 46 | SILVER | DEPOSITION | 15 | 10 | OUT OF PORTION | COMPARATIVE EXAMPLE |
| 10 | 9 | PEN | 25 | — | — | PHPS | VACUUM UV | No. 46 | SILVER | DEPOSITION | 15 | 10 | WITHIN PORTION | PRESENT INVENTION |
| 11 | 10 | PC | 25 | — | — | PHPS | VACUUM UV | No. 46 | SILVER | DEPOSITION | 15 | 10 | WITHIN PORTION | PRESENT INVENTION |
| 12 | 11 | PET | 5 | PET | 75 | PHPS | VACUUM UV | No. 46 | SILVER | DEPOSITION | 15 | 10 | OUT OF PORTION | PRESENT INVENTION |
| 13 | 12 | PET | 10 | PET | 75 | PHPS | VACUUM UV | No. 46 | SILVER | DEPOSITION | 15 | 10 | OUT OF PORTION | PRESENT INVENTION |
| 14 | 13 | PET | 25 | — | — | PHPS | VACUUM UV | No. 47 | SILVER | DEPOSITION | 15 | 10 | WITHIN PORTION | PRESENT INVENTION |
| 15 | 14 | PET | 25 | — | — | PHPS | VACUUM UV | PN41 | SILVER | DEPOSITION | 15 | 10 | WITHIN PORTION | PRESENT INVENTION |
| 16 | 15 | PET | 25 | — | — | PHPS | VACUUM UV | 3-15 | SILVER | DEPOSITION | 15 | 10 | WITHIN PORTION | PRESENT INVENTION |
| 17 | 16 | PET | 25 | — | — | PHPS | VACUUM UV | PS 1 | SILVER | DEPOSITION | 15 | 10 | WITHIN PORTION | PRESENT INVENTION |
| 18 | 17 | PET | 25 | — | — | PHPS | VACUUM UV | No. 46 | SILVER | SPUTTERING | 25 | 10 | WITHIN PORTION | COMPARATIVE EXAMPLE |
| 19 | 18 | PET | 25 | — | — | PHPS | VACUUM UV | No. 46 | SILVER | DEPOSITION | 10 | 10 | WITHIN PORTION | PRESENT INVENTION |
| 20 | 19 | PET | 25 | — | — | PHPS | VACUUM UV | No. 46 | SILVER | DEPOSITION | 20 | 10 | WITHIN PORTION | PRESENT INVENTION |
| 21 | 20 | PET | 25 | — | — | PHPS | VACUUM UV | No. 46 | SILVER | DEPOSITION | 30 | 10 | WITHIN PORTION | COMPARATIVE EXAMPLE |
| 22 | 21 | PET | 25 | — | — | HMDSO | PLASMA CVD | — | ITO | SPUTTERING | 15 | 25 | OUT OF PORTION | COMPARATIVE EXAMPLE |
| 23 | 22 | PET | 25 | — | — | HMDSO | PLASMA CVD | — | ITO | WET COATING | 300 | 25 | OUT OF PORTION | COMPARATIVE EXAMPLE |

*1: ORGANIC EL ELEMENT NO.
*2: MATERIAL
*3: THICKNESS (μm)
*4: PET FILM (75 μm)/ADHESION LAYER (20 μm)
*5: METHOD OF FORMATION
*6: EXEMPLARY COMPOUND
*7: THICKNESS(nm)
*8: SEALING RESIN LAYER (μm)
*9: POSITION OF TRANSPARENT ELECTRODE

The components described by the abbreviations in Table 3 are following compounds.
PET: poly(ethylene terephthalate)
PEN: poly(ethylene naphthalate)
PC: polycarbonate
HMDSO: hexamethyldisiloxane
PHPS: perhydropolysilazane To determine the position of each transparent anode (4), the neutral plane of each organic EL device was determined by methods described in Japanese Unexamined Patent Application Publications Nos. 2005-251671 and 2006-58764, and the total thickness D of each organic EL device was determined. The neutral region was determined to be a region extending upwardly and downwardly from the neutral plane in the range of 10% of D, and then whether the transparent anode resided within the neutral region was confirmed.

<<Evaluation of Transparent Conductive Film and Organic EL Device>>

[Evaluation of Flatness]

The surfaces of transparent conductive films 1 to 23 (the laminate of the layers from the resin substrate (1) to the transparent anode (4)) were visually observed to evaluate their flatness in accordance with the following criteria.

5: extremely high flatness and no deformation of the resin substrate were observed;

4: high flatness and little deformation of the resin substrate were observed;

3: partial small deformations after heating in the production of the transparent conductive film were observed, but the deformation would have little impact on the organic EL device to be formed thereon and thus would be a practically allowable level;

2: deformations after heating in the production of the transparent conductive film were observed, and the deformation would have impact on the organic EL device to be formed thereon and thus was practically problematic;

1: large deformations after heating in the production of the transparent conductive film were observed, and the organic EL device formed thereon would not to be flat.

[Evaluation of Resistance Parameter]

The sheet resistance ($\Omega/\square$) of each transparent conductive film was measured with a resistivity measurer (MCP-T610, Mitsubishi Chemical Corporation) by a constant current application mode using a four-terminal four-probe system. The resistivity was evaluated in accordance with the following criteria.

5: 5.0>sheet resistance ($\Omega/\square$)
4: 10>sheet resistance ($\Omega/\square$)≥5.0
3: 20>sheet resistance ($\Omega/\square$)≥10
2: 50>sheet resistance ($\Omega/\square$)≥20
1: sheet resistance ($\Omega/\square$)≥50

[Evaluation of Curve-Following Ability]

Given that the organic EL device may be attached on various curved articles, the fitting ability to a curved article was evaluated. The produced organic EL devices were each crimped on a polypropylene resin cylinder having a diameter of 10 mm. Their ability of following the curve of the cylinder (i.e., the fitting ability) of each organic EL device was visually observed, and evaluated in accordance with the following criteria.

5: the device had high ability of following the curve of the cylinder to entirely contact with the curve of the cylinder, and no gap or non-contacting region was observed;

4: the device had moderate ability of following the curve of the cylinder, and few gap or non-contacting region was observed;

3: small gaps or regions not contacting with the curve of the cylinder were locally observed, and the device almost entirely contacted with the cylinder by pressure;

2: the device had somewhat insufficient ability of following the curve of the cylinder, and gaps or non-contacting regions were observed;

1: the device had low ability of following the curve of the cylinder, and large gaps or non-contacting regions were observed.

[Evaluation of Bending Durability 1: High Temperature and Humidity Durability]

The organic EL devices were each wound around a plastic roller having a curvature of 6 mm$\phi$ such that the organic EL device side faced outward, and then kept at 85° C. and an RH of 85% for 500 hours. Subsequently, the organic EL devices were removed from the rollers. An electricity of 1 mA/cm$^2$ was applied to the organic EL devices, and the organic EL devices emitted light. A part of the luminescent region of each organic EL device was photographed with an optical microscope at a magnification of 100 (MS-804 with a lens MP-ZE25-200, MORITEX Corporation). The photograph was cut into a 2 mm square section, and the section was examined on whether a dark spot (s) were observed. The ratio of the dark spot area to the luminescent area was calculated based on the observation. The dark spot resistance was evaluated in accordance with the following criteria.

5: no observable dark spot
4: 1.0%>dark spot area≥0.1%
3: 3.0%>dark spot area≥1.0%
2: 6.0%>dark spot area≥3.0%
1: dark spot area≥6.0%

[Evaluation of Bending Durability 2: Bending Durability]

The organic EL devices were each wound around a plastic roller having a curvature of 6 mm$\phi$ such that the organic EL device side faced outward, kept at 25° C. and an RH of 55% for 10 seconds, and then removed from the roller. This process was repeated 1000 times. Subsequently, the organic EL devices were removed from the rollers. An electricity of 1 mA/cm$^2$ was applied to the organic EL devices, and the organic EL devices emitted light. A part of the luminescent region of each organic EL device was photographed with an optical microscope at a magnification of 100 (MS-804 with a lens MP-ZE25-200, MORITEX Corporation). The photograph was cut into a 2 mm square section, and the section was examined on whether a dark spot (s) were observed. Based on the observation, the ratio of the dark spot area to the luminescent area was calculated. The dark spot resistance was evaluated in accordance with criteria below, and defined as an index of the durability against bending.

5: no observable dark spot
4: 1.0%>dark spot area≥0.1%
3: 3.0%>dark spot area≥1.0%
2: 6.0%>dark spot area≥3.0%
1: dark spot area≥6.0%

Results are shown in Table 4.

TABLE 4

| | | | | EVALUATION OF BENDING DURABILITY | | |
|---|---|---|---|---|---|---|
| *1 | FLATNESS | RESISTANCE PARAMETER | CURVE-FOLLOWING ABILITY | EVALUATION 1 HIGH TEMPERATURE AND HUMIDITY DURABILITY | EVALUATION 2 BENDING DURABILITY | NOTE |
| 1 | 3 | 3 | 4 | 3 | 3 | PRESENT INVENTION |
| 2 | 3 | 4 | 4 | 4 | 4 | PRESENT INVENTION |
| 3 | 4 | 5 | 4 | 4 | 4 | PRESENT INVENTION |
| 4 | 4 | 5 | 4 | 5 | 5 | PRESENT INVENTION |
| 5 | 3 | 5 | 5 | 4 | 3 | PRESENT INVENTION |
| 6 | 4 | 5 | 5 | 4 | 4 | PRESENT INVENTION |
| 7 | 5 | 5 | 3 | 3 | 4 | PRESENT INVENTION |
| 8 | 5 | 4 | 2 | 2 | 2 | COMPARATIVE EXAMPLE |
| 9 | 5 | 3 | 1 | 2 | 1 | COMPARATIVE EXAMPLE |

TABLE 4-continued

| *1 | FLATNESS | RESISTANCE PARAMETER | CURVE-FOLLOWING ABILITY | EVALUATION 1 HIGH TEMPERATURE AND HUMIDITY DURABILITY | EVALUATION 2 BENDING DURABILITY | NOTE |
|---|---|---|---|---|---|---|
| 10 | 4 | 5 | 4 | 5 | 5 | PRESENT INVENTION |
| 11 | 4 | 5 | 4 | 5 | 5 | PRESENT INVENTION |
| 12 | 5 | 5 | 5 | 4 | 3 | PRESENT INVENTION |
| 13 | 5 | 5 | 5 | 4 | 4 | PRESENT INVENTION |
| 14 | 4 | 5 | 4 | 5 | 5 | PRESENT INVENTION |
| 15 | 4 | 5 | 4 | 5 | 5 | PRESENT INVENTION |
| 16 | 4 | 4 | 4 | 4 | 5 | PRESENT INVENTION |
| 17 | 4 | 4 | 4 | 4 | 5 | PRESENT INVENTION |
| 18 | 1 | 3 | 4 | 3 | 3 | COMPARATIVE EXAMPLE |
| 19 | 4 | 3 | 4 | 5 | 5 | PRESENT INVENTION |
| 20 | 4 | 5 | 4 | 4 | 4 | PRESENT INVENTION |
| 21 | 2 | 5 | 4 | 3 | 2 | COMPARATIVE EXAMPLE |
| 22 | 1 | 2 | 3 | 2 | 1 | COMPARATIVE EXAMPLE |
| 23 | 3 | 1 | 3 | 2 | 2 | COMPARATIVE EXAMPLE |

*1: ORGANIC EL ELEMENT NO.

As is evident from the results shown in Table 4, the organic EL devices having the resin substrates and the transparent anodes defined in the present invention have higher flatness, resistance, curve-following ability than those of Comparative Examples, and have high durability against bending after the storage in a hot and humid environment and high durability against repeated bending operations.

In detail, the comparison between organic EL devices 4 to 9 demonstrates that a thickness of the resin substrate in the range of 5 to 50 achieves the advantageous effects described above. In addition, the comparison between organic EL devices 4 and 18 to 20 demonstrates that a thickness of the transparent anode in the range of 2 to 20 nm achieves the advantageous effects described above.

In the organic EL device of the present invention, the advantageous effects of the present invention described above is enhanced by the use of the underlying layer containing a nitrogen or sulfur atom-containing organic compound under the transparent anode (organic EL devices 2 to 7, 10 to 17, 19, and 20), formation of the transparent anode by deposition (comparison between organic EL devices 4 and 18), disposal of the transparent anode within the neutral region (comparison between organic EL devices 3 and 4), and use of the support film on the thin resin substrate (comparison between organic EL devices 12 and 5, and 13 and 6).

INDUSTRIAL APPLICABILITY

The organic electroluminescent device of the present invention has high pliability, high flexibility, and high durability against bending stress. The organic EL device can be applied to surface-emitting articles, such as backlights of various displays, display boards, e.g., billboards and emergency lights, and light sources. The organic EL device having high flexibility can also be applied to a light-emitting device that can be naturally and elastically bent when disposed on curved members or bent as desired, and thus is beneficial for providing dramatic rendering and decoration.

REFERENCE SIGNS LIST 1 resin substrate
2 gas barrier layer
3 underlying layer
4 transparent anode
5 organic functional layer group
6 cathode
7 adhesion layer
9 sealing material
11 neutral plane
12 neutral region
ELD organic electroluminescent device (organic EL device)
TF transparent conductive film
S sealing member
C compressive force
CS compressive stress
D total thickness
F bending force
T tensile force
TS tensile stress

The invention claimed is:

1. An organic electroluminescent device comprising:
    a substrate;
    a pair of counter electrodes on or above the substrate; and
    a luminous layer disposed between the electrodes,
    wherein the substrate is a resin substrate having a thickness in the range of 3 to 50 μm, and the electrode adjacent to the resin substrate is a transparent anode primarily composed of silver and having a thickness in the range of 2 to 20 nm, and
    wherein the transparent anode is disposed in a neutral region of stress generated when the organic electroluminescent device undergoes bending moment.

2. The organic electroluminescent device according to claim 1, further comprising an underlying layer on a side of the transparent anode, the side being adjacent to the resin substrate, the underlying layer comprising an organic compound containing a nitrogen or sulfur atom.

3. The organic electroluminescent device according to claim 2, wherein the organic compound contained in the underlying layer is an organic compound containing a nitrogen atom having an effective unshaved electron pair which is not involved in aromaticity.

4. The organic electroluminescent device according to claim 1, wherein the resin substrate resides on a light emitting side, the organic electroluminescent device further comprises a gas barrier layer between the resin substrate and the transparent anode, and the gas barrier layer is a modified polysilazane layer.

5. A method of producing an organic electroluminescent device comprising forming a pair of counter electrodes on or above a substrate, and a luminous layer disposed between the electrodes,
- wherein the substrate is a resin substrate having a thickness in the range of 3 to 50 μm, the electrode adjacent to the resin substrate is a transparent anode primarily composed. of silver and having a thickness in the range of 2 to 20 nm, and the transparent anode is formed by deposition, and
- wherein the transparent anode is disposed in a neutral region of stress generated when the organic electroluminescent device undergoes bending moment.

6. The method of producing an organic electroluminescent device according to claim 5, wherein an underlying layer comprising an organic compound containing a nitrogen or sulfur atom is formed at a side of the transparent anode, the side being adjacent to the resin substrate.

7. The method of producing an organic electroluminescent device according to claim 5,
- wherein the resin substrate resides on a light emitting side, a gas barrier layer is formed between the resin substrate and the transparent anode by modifying a polysilazane-containing layer by vacuum UV irradiation.

* * * * *